United States Patent
Lu et al.

(10) Patent No.: US 12,033,870 B2
(45) Date of Patent: Jul. 9, 2024

(54) BUMP STRUCTURE AND METHOD OF MAKING THE SAME

(71) Applicant: TAIWAN SEMICONDUCTOR MANUFACTURING COMPANY, LTD., Hsinchu (TW)

(72) Inventors: Wen-Hsiung Lu, Tainan (TW); Ming-Da Cheng, Taoyuan (TW); Su-Fei Lin, Tainan (TW); Hsu-Lun Liu, Tainan (TW); Chien-Pin Chan, Pingzhen (TW); Yung-Sheng Lin, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/865,305

(22) Filed: Jul. 14, 2022

(65) Prior Publication Data

US 2022/0351983 A1  Nov. 3, 2022

Related U.S. Application Data

(62) Division of application No. 17/085,346, filed on Oct. 30, 2020, now Pat. No. 11,417,539.

(Continued)

(51) Int. Cl.
*H01L 21/48* (2006.01)
*C25D 5/00* (2006.01)
(Continued)

(52) U.S. Cl.
CPC ............ *H01L 21/4853* (2013.01); *C25D 5/60* (2020.08); *H01L 21/486* (2013.01);
(Continued)

(58) Field of Classification Search
CPC ........... C25D 5/60; H01L 24/03; H01L 24/13; H01L 24/11; H01L 23/49816;
(Continued)

(56) References Cited

U.S. PATENT DOCUMENTS

| 5,298,459 A | 3/1994 | Arikawa et al. |
| 6,417,089 B1 | 7/2002 | Kim et al. |

(Continued)

FOREIGN PATENT DOCUMENTS

| CN | 102456657 A | 5/2012 |
| JP | 2004-228295 A | 8/2004 |
| KR | 10-2007-0119553 A | 12/2007 |

OTHER PUBLICATIONS

Notice of Allowance issued in U.S. Appl. No. 17/085,346, dated Apr. 1, 2022.

*Primary Examiner* — Evan G Clinton
(74) *Attorney, Agent, or Firm* — STUDEBAKER & BRACKETT PC

(57) ABSTRACT

In a method of manufacturing a semiconductor device first conductive layers are formed over a substrate. A first photoresist layer is formed over the first conductive layers. The first conductive layers are etched by using the first photoresist layer as an etching mask, to form an island pattern of the first conductive layers separated from a bus bar pattern of the first conductive layers by a ring shape groove. A connection pattern is formed to connect the island pattern and the bus bar pattern. A second photoresist layer is formed over the first conductive layers and the connection pattern. The second photoresist layer includes an opening over the island pattern. Second conductive layers are formed on the island pattern in the opening. The second photoresist layer is removed, and the connection pattern is removed, thereby forming a bump structure.

20 Claims, 19 Drawing Sheets

Related U.S. Application Data

(60) Provisional application No. 62/982,733, filed on Feb. 27, 2020.

(51) Int. Cl.
  *H01L 23/00* (2006.01)
  *H01L 23/498* (2006.01)
  *H01L 23/538* (2006.01)

(52) U.S. Cl.
  CPC .... *H01L 23/49811* (2013.01); *H01L 23/5384* (2013.01); *H01L 24/14* (2013.01)

(58) Field of Classification Search
  CPC ... H01L 24/10; H01L 21/4853; H01L 21/486; H01L 23/49811; H01L 23/5384; H01L 24/14; H01L 24/05; H01L 21/2885; H01L 21/76885
  See application file for complete search history.

(56) References Cited

U.S. PATENT DOCUMENTS

| | | |
|---|---|---|
| 7,728,431 B2 | 6/2010 | Harada et al. |
| 8,993,380 B2 | 3/2015 | Hou et al. |
| 9,281,254 B2 | 3/2016 | Yu et al. |
| 9,299,649 B2 | 3/2016 | Chiu et al. |
| 9,372,206 B2 | 6/2016 | Wu et al. |
| 9,425,126 B2 | 8/2016 | Kuo et al. |
| 9,443,783 B2 | 9/2016 | Lin et al. |
| 9,461,018 B1 | 10/2016 | Tsai et al. |
| 9,496,189 B2 | 11/2016 | Yu et al. |
| 9,666,502 B2 | 5/2017 | Chen et al. |
| 9,735,131 B2 | 8/2017 | Su et al. |
| 10,147,692 B2 | 12/2018 | Chen et al. |
| 2007/0290343 A1 | 12/2007 | Harada et al. |
| 2012/0098124 A1* | 4/2012 | Wu .......................... H01L 24/11 257/737 |
| 2015/0340332 A1 | 11/2015 | Rinne et al. |
| 2017/0084558 A1* | 3/2017 | Seo .......................... H01L 24/11 |

\* cited by examiner

BUMP STRUCTURE AND METHOD OF MAKING THE SAME

RELATED APPLICATIONS

This application is a divisional of U.S. patent application Ser. No. 17/085,346 filed Oct. 30, 2020, which claims priority to U.S. Provisional Patent Application No. 62/982,733 filed Feb. 27, 2020, the entire contents of which are incorporated herein by reference.

BACKGROUND

As consumer devices with ever better performance have gotten smaller and smaller in response to consumer demand, the individual components of these devices have necessarily decreased in size as well. Semiconductor devices, which make up major components of consumer devices such as mobile phones, computer tablets, and the like, have become smaller and smaller. The decrease in size of semiconductor devices has been met with advancements in semiconductor manufacturing techniques such as forming connections between semiconductor devices.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1A:
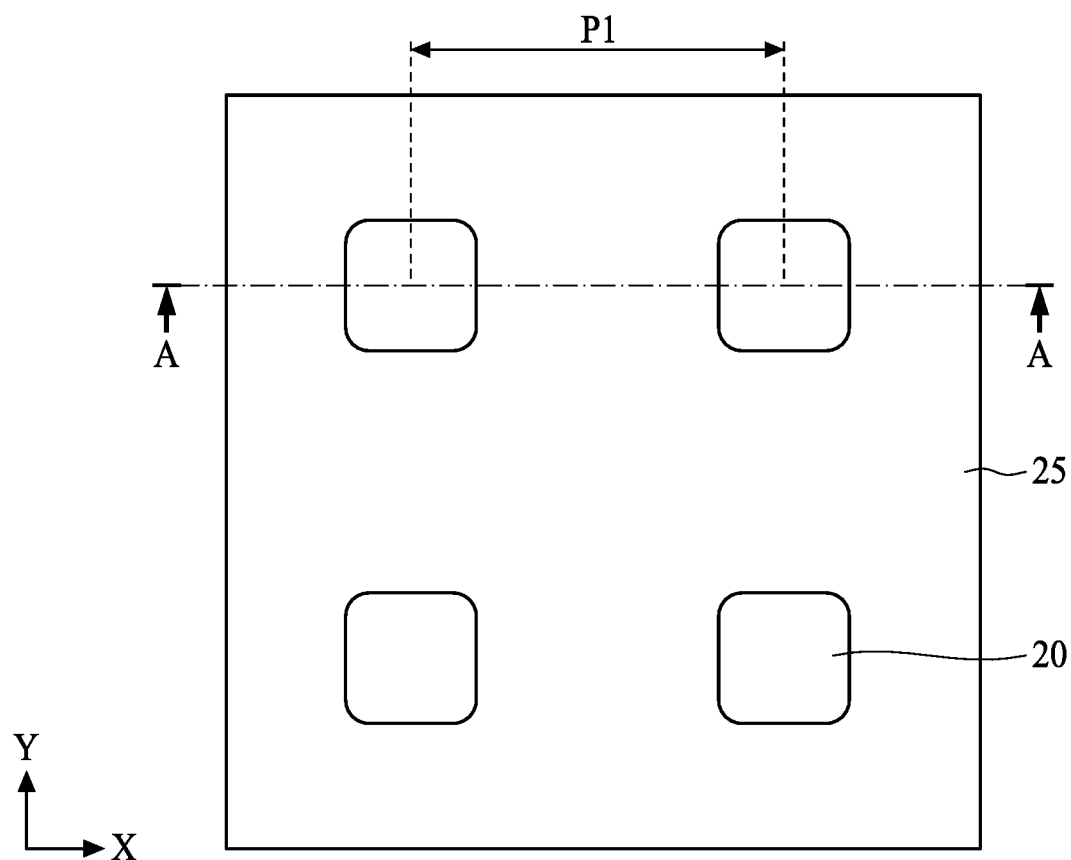
FIGS. 1A and 1B show one of the stages of a sequential manufacturing operation of a semiconductor device according to an embodiment of the present disclosure.

It is to be understood that the following disclosure provides many different embodiments, or examples, for implementing different features of the disclosure. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of."

As the electronic industry develops three-dimensional integrated circuits (3D IC) based on through-Si-vias (TSV) technology, the processing and reliability of bumps, which are used to interconnect the stacked chips, is being actively investigated. In the course of reduction in size of the bumps, the diameter of a bump is reduced to about one order of magnitude smaller than that of flip chip solder joints, and the volume is about 1000 times smaller. The much smaller size of the solder joints increases the possibility of failure of the bump solder joints.

Bumps are generally formed by using an electroplating method. In an electroplating method, a seed layer and/or an underlying conductive layer, which may be collectively referred to an under bump metallization (UBM) layer, are formed over a substrate or a wafer, in which semiconductor devices, such as integrated circuits, are formed. The UBM layer provides an electrical path for the electroplating process.

In some examples, after the bumps are formed, the UBM layer is patterned (etched) to electrically separate portions of the UBM layer bumps on which the bumps are formed. The etching of the UBM layer should be well-controlled not to etch the bumps and/or the UBM layer under the bumps. When the UBM layer under the bumps is over-etched, an under cut is formed around the bottom of the bumps, and the bumps may collapse.

In the present disclosure, a novel technology to form bump structures that can minimize an under cut in the UBM layer is provided.

FIGS. 1A and 1B to 9A-9F show various views a sequential manufacturing operation of a bump structure over a semiconductor circuit according to an embodiment of the present disclosure. It is understood that additional operations can be provided before, during, and after processes shown by FIGS. 1A-9F, and some of the operations described below can be replaced or eliminated, for additional embodiments of the method. The order of the operations/processes may be interchangeable. In 1A and 1B to 9A-9F, the "A" figures show a plan view (a top view or a projected view) and the "B" figures show a cross sectional view along line A-A of the "A" figures.

Figure 1B:
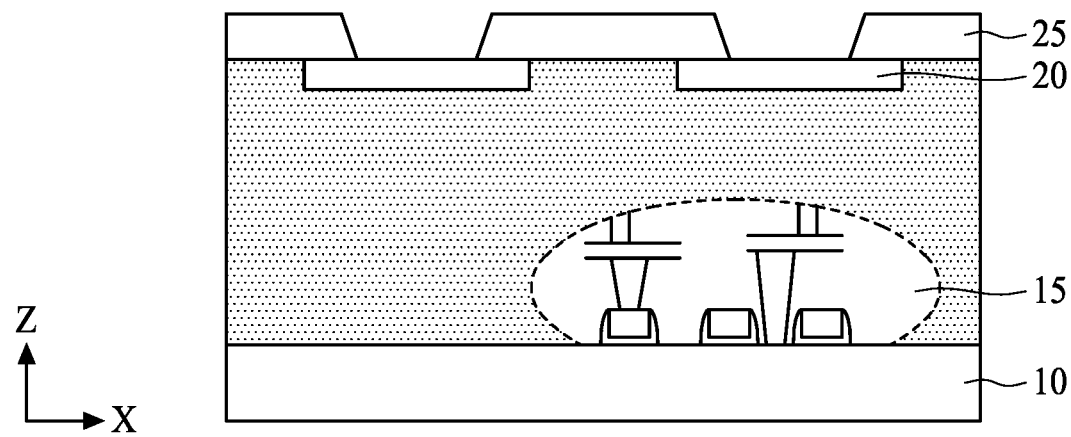

As shown in FIGS. 1A and 1B, a plurality of pad electrodes 20, on which bump structures are to be formed, are arranged over a semiconductor circuit 15 formed on a substrate 10. The pad electrodes 20 are formed of a suitable conductive metal, including aluminum, copper, silver, gold, nickel, tungsten, titanium, alloys thereof, and/or multilayers thereof. The pad electrodes 20 are formed by a suitable metal deposition operation, including electro or electroless plating, physical vapor deposition (PVD) including sputtering, chemical vapor deposition (CVD), atomic layer deposition (ALD), thermal evaporation, or electron beam evaporation. The pad electrodes 20 are arranged in a row-column arrangement in some embodiments.

In some embodiments, the semiconductor circuit 15 includes transistors (e.g., field effect transistors (FETs)), capacitors, inductors, resistors, or the like in some embodiments. The pad electrodes 20 are electrically coupled to the semiconductor circuit 15 through underlying interconnection layers including wiring layers and vias formed in dielectric layers, such as an interlayer dielectric (ILD) layer or an intermetal dielectric (IMD) layer in some embodiments. The wiring layers and vias of the interconnection layer may be formed of copper or copper alloys (e.g., AlCu), aluminum, tungsten, nickel, or any other suitable metal. The wiring layers and vias may be formed using damascene processes.

In some embodiments, the pad electrodes 20 have a width W1 ranging from about 10 μm to about 500 μm as seen in plan view. In other embodiments, the pad electrode 20 have the width W1 ranging from about 20 μm to about 100 μm. In some embodiments, the plurality of pad electrodes 20 are arranged in a row-column arrangement having a pitch P1 of about 20 μm to about 100 μm. In some embodiments, the pitch along the X direction is the same as or different from the pitch along the Y direction.

A 2×2 arrangement of the pad electrodes 20 is illustrated, but the disclosure is not limited to a 2×2 arrangement. Other arrangements, including a fewer or greater number of rows or columns of pad electrodes 20 are included in the scope of this disclosure. For example, the arrangement may be a 10×10 arrangement, or a greater number of column and rows. The arrangement of pad electrodes 20 is not limited to a rectangular arrangement. In some embodiments, other arrangements include staggered rows and columns, where each pad electrode 20 is immediately adjacent to six other pad electrodes 20. In other embodiments, the pad electrodes 20 are arranged in a concentric circular arrangement. In other embodiments, the pad electrodes 20 are arranged around the periphery of the substrate or in a central portion of the substrate. In other embodiments, the pad electrodes 20 are irregularly spaced. In some embodiments, up to about 10,000 pad electrodes 20 are formed on the substrate. As set forth below, bump structures are formed over the pad electrodes 20. Accordingly, the bump structures have the same arrangement as the pad electrodes 20 in some embodiments.

In some embodiments, the substrate 10 is formed of at least one selected from the group consisting of silicon, diamond, germanium, SiGe, SiGeSn, SiGeC, GeSn, SiSn, GaAs, InGaAs, InAs, InP, InSb, GaAsP, GaInP, and SiC. In some embodiments, the semiconductor substrate 10 is a silicon wafer or substrate.

In some embodiments, one or more passivation layer 25 are formed over the pad electrodes 20 as shown in FIGS. 1A and 1B. The passivation layer 25 includes one or more layers of silicon oxide, silicon nitride, SiON, SiC, SiOCN, SiCN or any other suitable insulating layers. The passivation layer 25 is patterned using suitable photolithography and etching operations to form openings, in which part of the pad electrodes are exposed as shown in FIGS. 1A and 1B. In some embodiments, the opening has a tapered shape as shown in FIG. 1B.

Figure 2A:
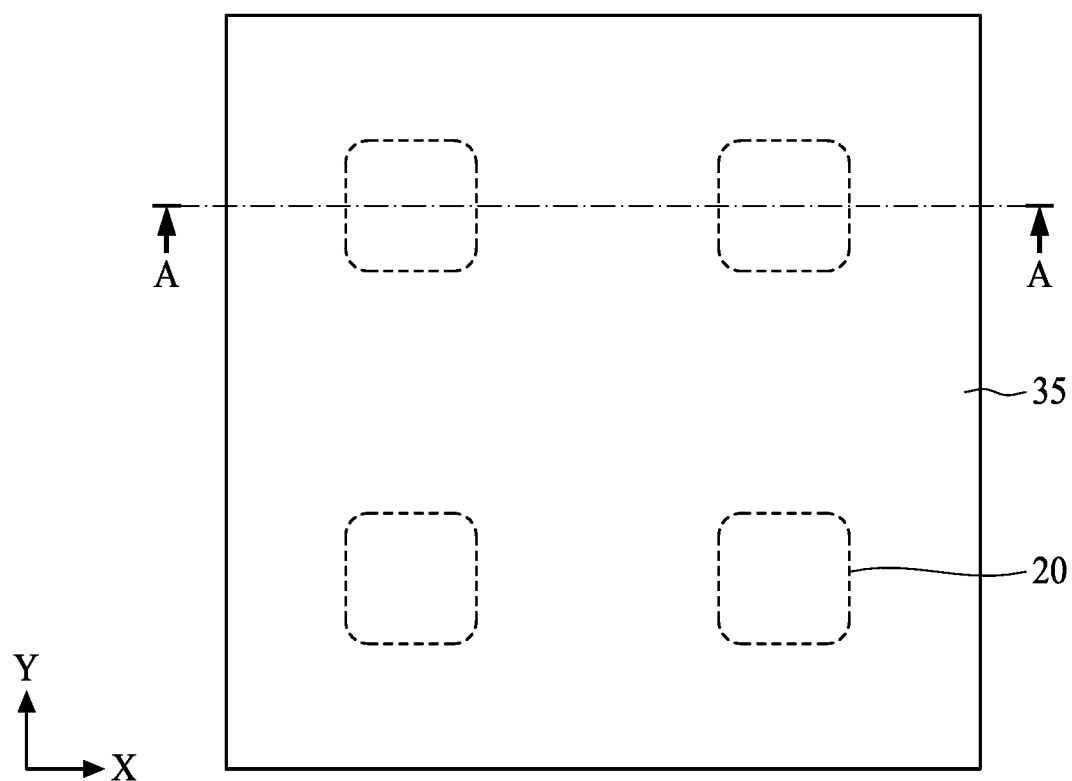
FIGS. 2A and 2B show one of the stages of a sequential manufacturing operation of a semiconductor device according to an embodiment of the present disclosure.
Figure 2B:
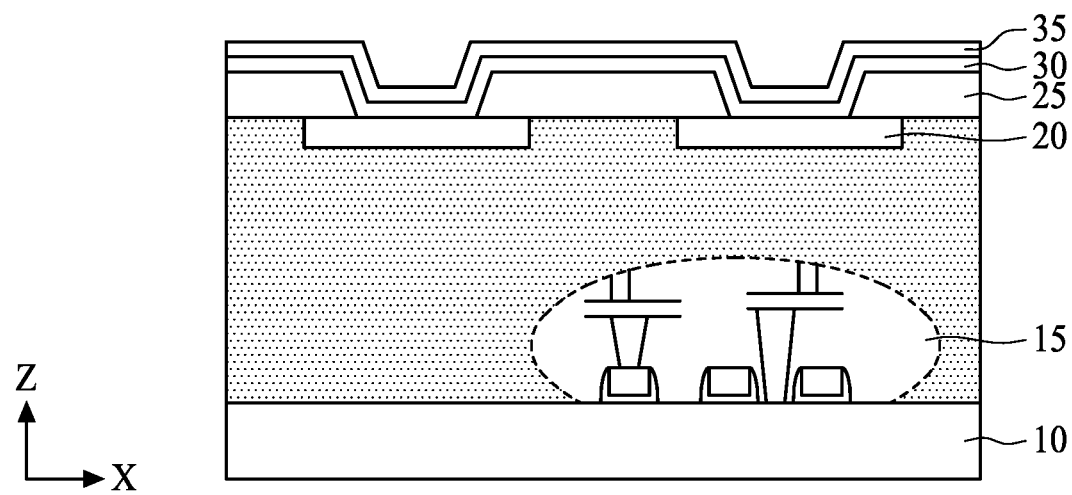

Then, as shown in FIGS. 2A and 2B, one or more conductive layers, as UBM layers, are formed over the passivation layer 25 and the exposed pad electrodes 20. In some embodiments, the UBM layers include an underlying conductive layer 30 and a seed layer 35 formed on the underlying conductive layer 30. In some embodiments, the underlying conductive layer includes Ti, TiN or TiW, and the seed layer 35 includes copper or a copper alloy. A copper alloy contains 50 mol % or greater copper in some embodiments. In some embodiments, the UBM layers are formed by a suitable metal deposition operation, including physical vapor deposition (PVD) including sputtering, chemical vapor deposition (CVD), atomic layer deposition (ALD), thermal evaporation, and electron beam evaporation. In some embodiments, each of the underlying conductive layer 30 and the seed layer 35 has a thickness ranging from about 20 nm to about 100 nm.

Figure 3A:
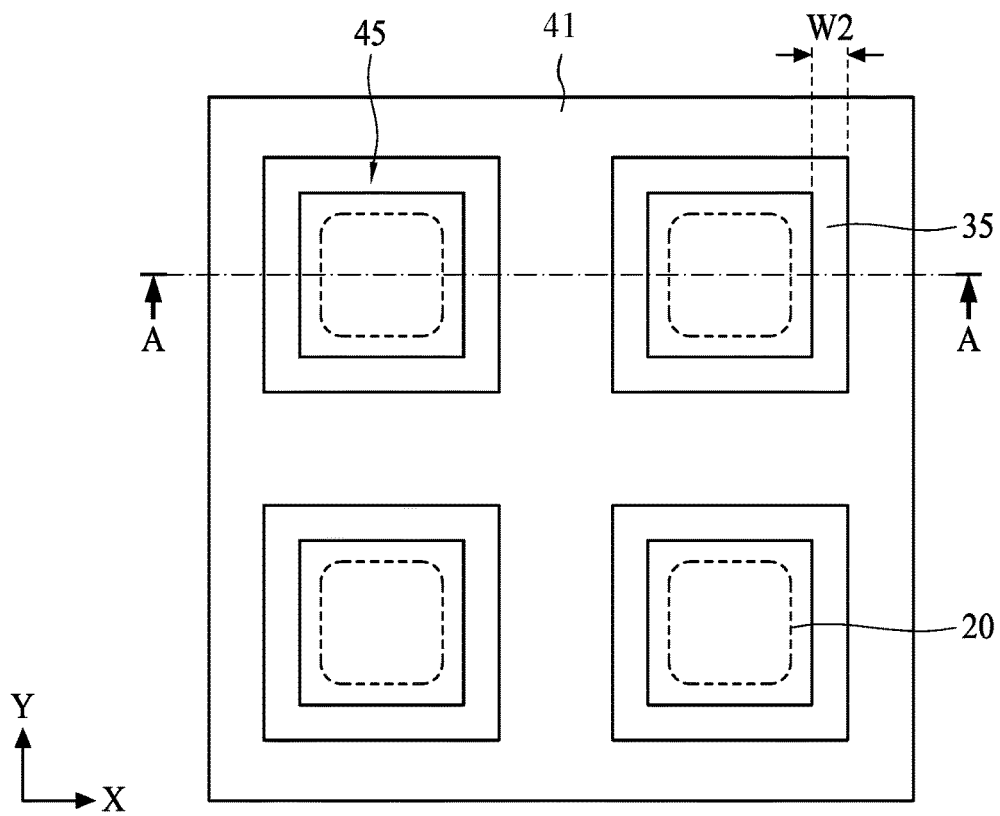
FIGS. 3A and 3B show one of the stages of a sequential manufacturing operation of a semiconductor device according to an embodiment of the present disclosure.
Figure 3B:
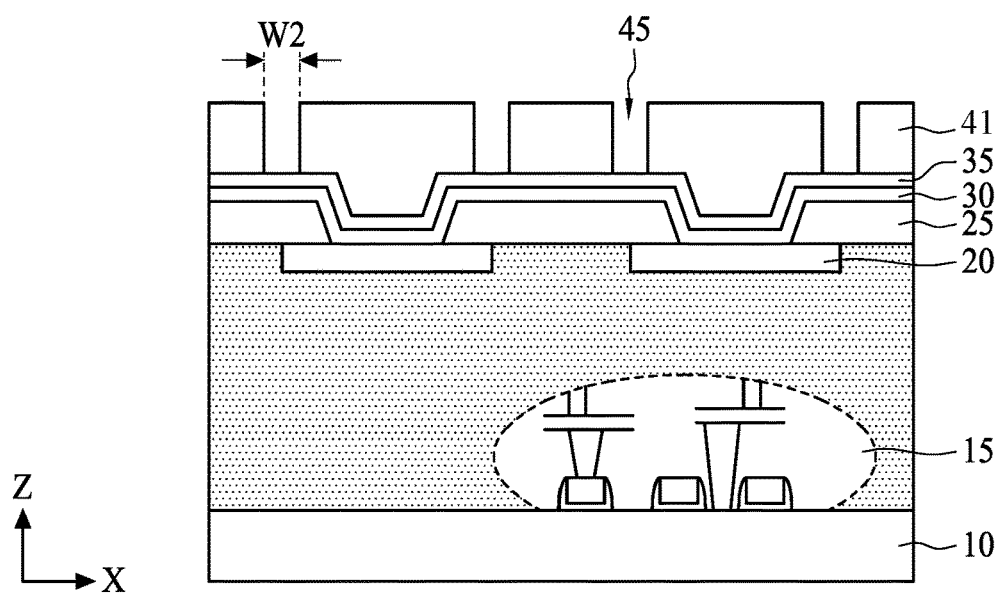

Next, a photoresist layer 41 is formed over the UBM layers 30, 35, as shown in FIGS. 3A and 3B. The photoresist layer 41 can be a positive photoresist or a negative photoresist. When the photoresist is a positive resist, the portion of the photoresist exposed to the actinic radiation becomes soluble in the developer and is removed during the development operation. When the photoresist is a negative photoresist, the portion of the photoresist exposed to actinic radiation becomes insoluble in the developer and remains on the device, while the portion not exposed to the actinic radiation is removed, during the development operation. In some embodiments, the actinic radiation is ultraviolet radiation including i-line and g-line radiation, and deep ultraviolet radiation. In some embodiments, the actinic radiation is generated by a mercury arc lamp, or a laser, including ArF and KrF excimer lasers.

The photoresist layer 41 is subsequently selectively exposed to actinic radiation, and developed to form a plurality of first openings 45 exposing the UBM layer (the seed layer 35), as shown in FIGS. 3A and 3B. In some embodiments, the first opening 45 has a ring or a frame shape as shown in FIG. 3A. In some embodiments, the first opening 45 surrounds the pad electrode 20 in plan view. In other embodiments, the first opening 45 overlaps the periphery of the pad electrode 20. In certain embodiments, the periphery of the pad electrode is located outside the first opening 45. In some embodiments, the width W2 of the first opening 45 is in a range from about 0.1 μm to about 1 μm.

Figure 4A:
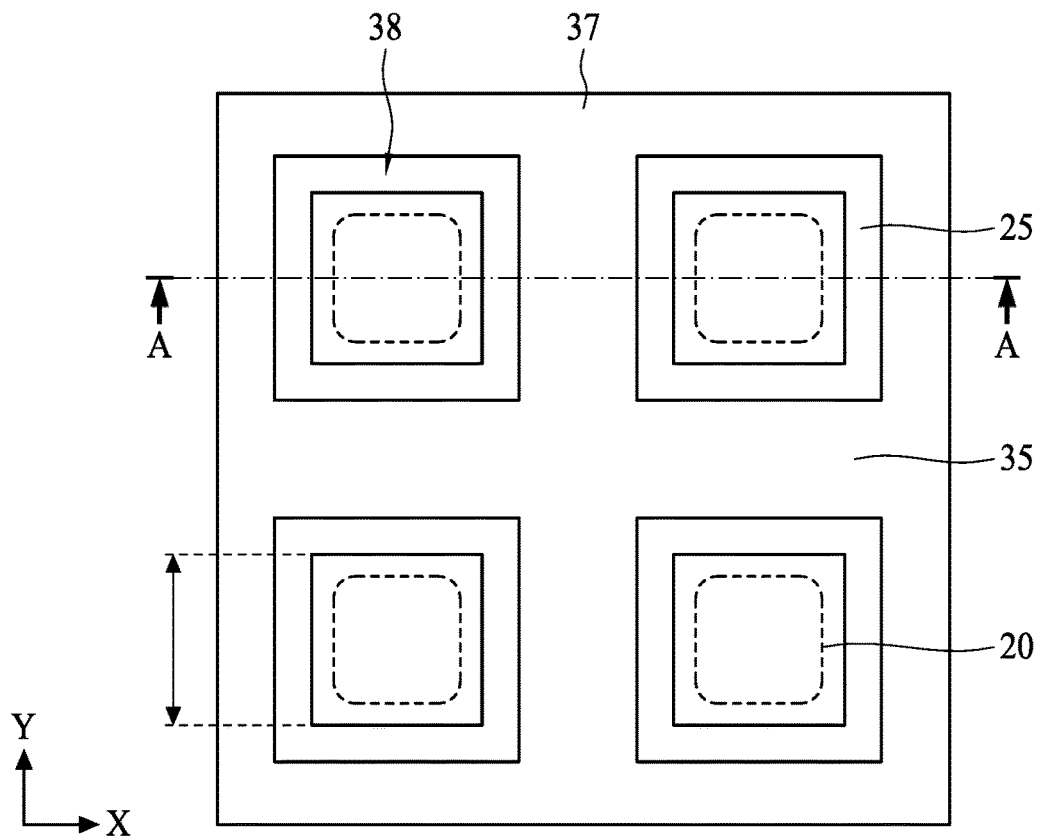
FIGS. 4A and 4B show one of the stages of a sequential manufacturing operation of a semiconductor device according to an embodiment of the present disclosure.
Figure 4B:
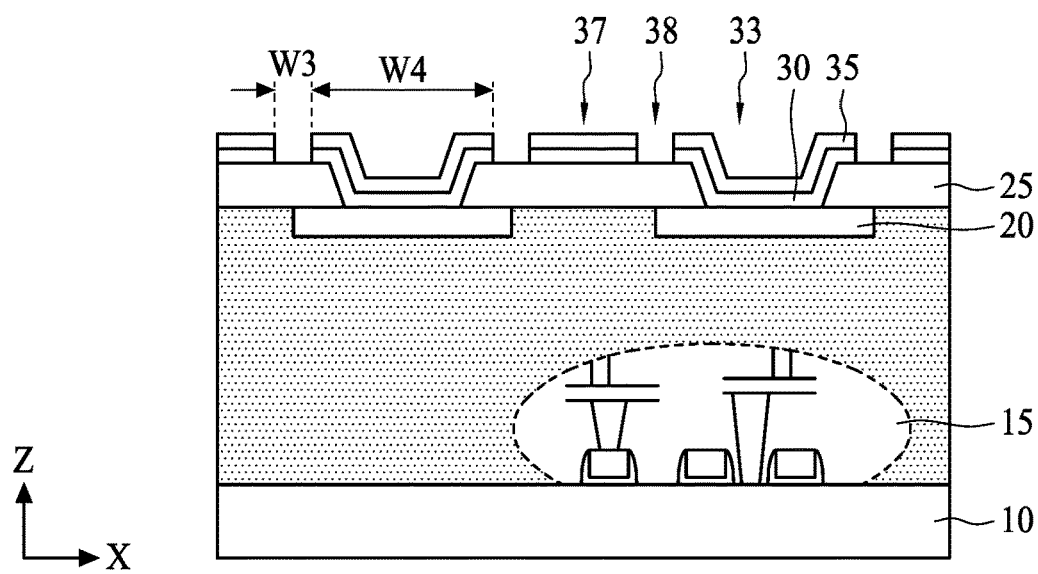

Then, as shown in FIGS. 4A and 4B, the UBM layers 30 and 35 are patterned by using the photoresist layer 41 as an etching mask. The etching includes one or more of dry etching and wet etching. As shown in FIGS. 4A and 4B, a groove 38 are formed to surround an island pattern 33 of the UBM layers 30 and 35, under which the pad electrode 20 is disposed. Each of the island patterns of the UBM layers 30 and 35 is electrically isolated from a bus bar pattern 37 formed of the UBM layers by the groove 38. In some embodiments, the width W3 of the groove 38 is in a range from about 0.1 μm to about 1 μm. In some embodiments, the width W4 of the island pattern 33 is in a range from about 10 μm to about 500 μm, and is in a range from about 20 μm to about 100 μm in other embodiments. In some embodiments, the width W4 of the island pattern 33 is the same as, smaller than or larger than the width W1 of the pad electrode 20. In some embodiments, the groove 38 has a circular shape having a diameter in a range from about 10 μm to about 500 μm or in a range from about 20 μm to about 100 μm. The photoresist layer 41 is removed by using a suitable photoresist stripper solution or by an oxygen plasma ashing operation.

Figure 5A:
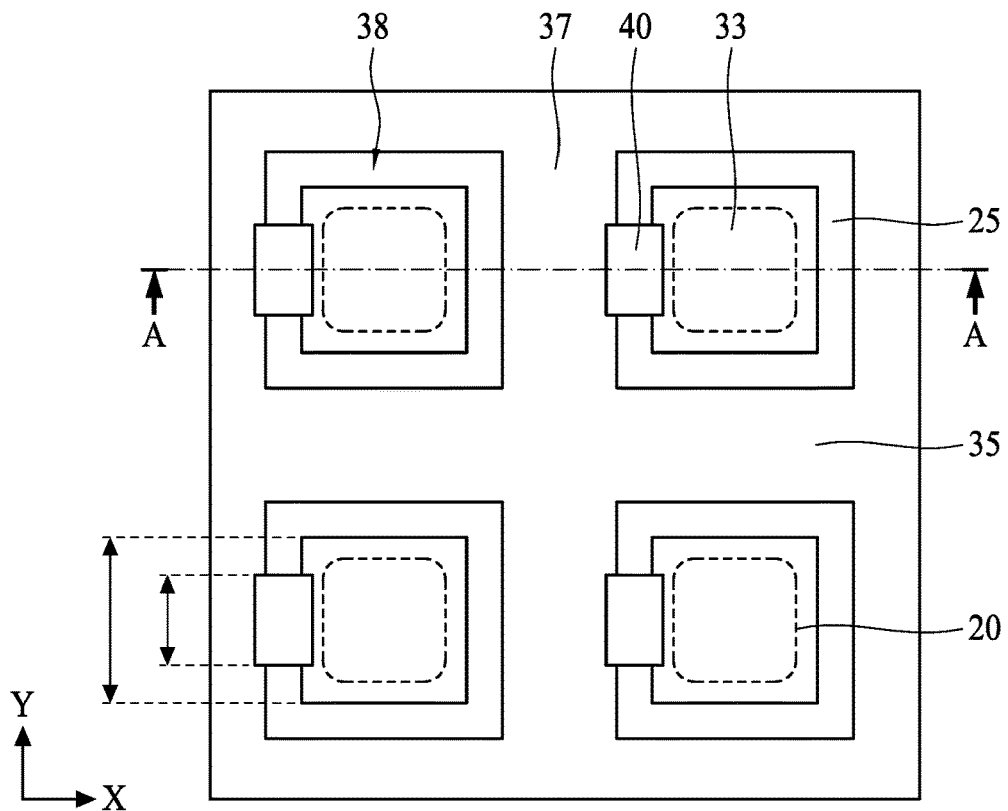
FIGS. 5A and 5B show one of the stages of a sequential manufacturing operation of a semiconductor device according to an embodiment of the present disclosure.
Figure 5B:
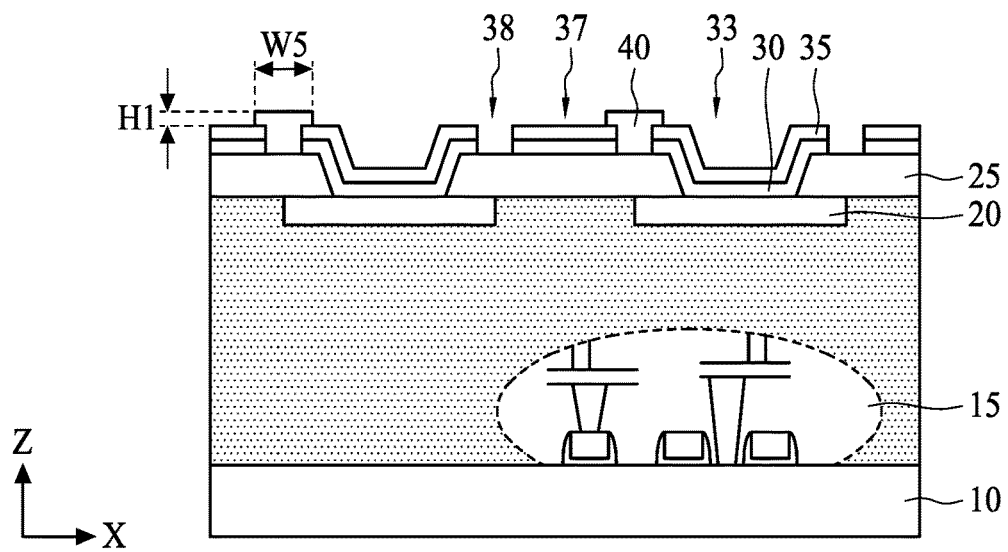

Then, as shown in FIGS. 5A and 5B, a conductive connector pattern 40 is formed to connect the bus bar pattern 37 and the island pattern 33. One or more conductive layers are formed over the structure shown in FIGS. 4A and 4B, and then one or more lithography and etching operations are performed to form a plurality of conductive connector patterns 40.

The conductive connector pattern 40 is formed by a suitable metal deposition operation, including electro or electroless plating, physical vapor deposition (PVD) including sputtering, chemical vapor deposition (CVD), atomic layer deposition (ALD), thermal evaporation, or electron beam evaporation. In some embodiments, the conductive connector pattern 40 is made of a metal or a metallic material, that can be selectively removable from the UBM layers and a bump structure subsequently formed. In some embodiments, the conductive connector pattern 40 includes Al, Ni, Co, W, Au, Ag, Sn, Ta, and/or alloys thereof.

In some embodiments, the conductive connector pattern 40 extends a distance H1 of about 200 nm to about 500 nm above the surface of the seed layer 35. In some embodiments, the conductive connector pattern 40 has a width W5 (X direction) greater than the width W3 of the groove 38. In some embodiments, the width W5 of the conductive connector pattern 40 is 100 nm about 1,000 nm greater than the width W3. Thus, the cross section of the conductive connector pattern 40 has a flange shape having a thick center portion and a thin peripheral portion. By the conductive connector pattern 40, the bus bar pattern 37 and each of the island pattern 33 are electrically connected.

Figure 6A:
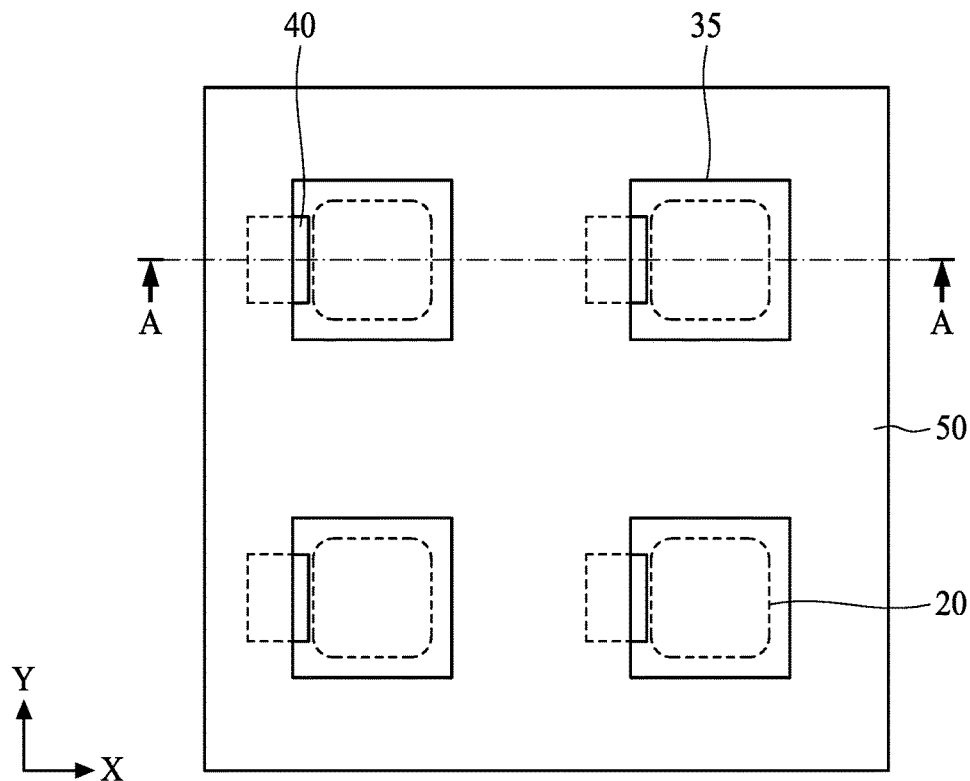
FIGS. 6A and 6B show one of the stages of a sequential manufacturing operation of a semiconductor device according to an embodiment of the present disclosure.
Figure 6B:
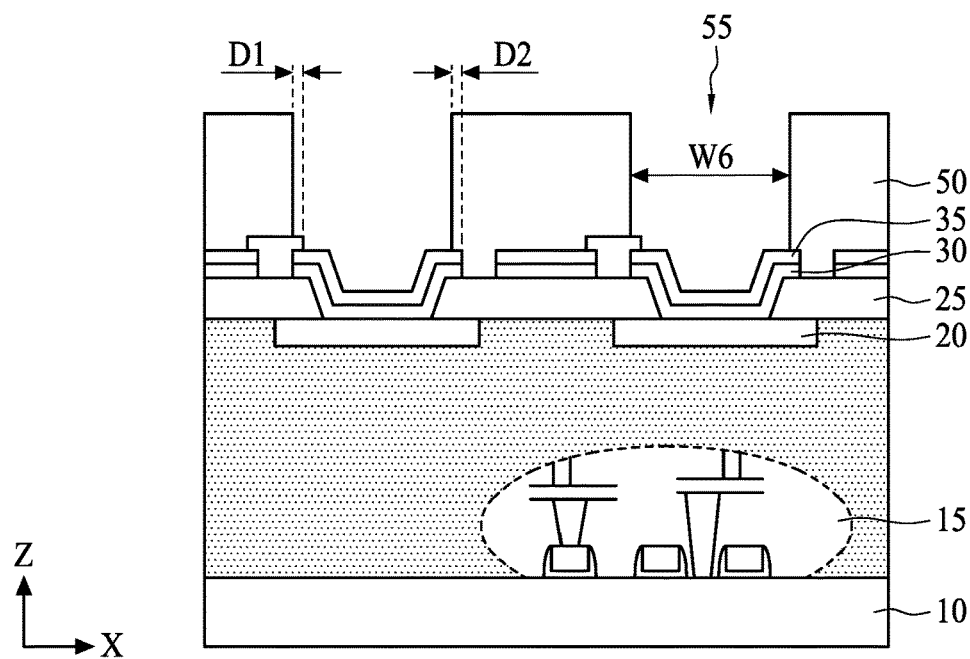

Next, as shown in FIGS. 6A and 6B, a second photoresist layer 50 having second openings 55 is formed over the structure shown in FIGS. 5A and 5B. The second openings 55 are subsequently filled with one or more conductive materials to form a bump structure. The second opening 55 has a width W6 in a range from about 10 μm to about 500 μm in some embodiments, and in a range from about 20 μm to about 100 μm in other embodiments.

In some embodiments, as shown in FIGS. 6A and 6B, a part of the conductive connection pattern 40 is exposed in the second opening 55. The protruding amount D1 of the conductive connection pattern 40 in the second opening 55 is in a range from about 0 nm to about 500 nm in some embodiments, and is in a range from about 50 nm to 200 nm in other embodiments. If the amount D1 is smaller than 0 nm, the photo resist pattern fully covers the conductive connection pattern 40. If the amount D1 is too large, the under-cut subsequently formed would be too large. In some embodiments, the edge of the second opening on the conductive connection pattern 40 is located above the groove 38 (located above the thick center portion of the flange shape of the conductive connection pattern 40) or is located above the island pattern 33 (on the peripheral thin portion of the flange shape of the conductive connection pattern 40 disposed on the island pattern 33). In some embodiments, the edge of the second opening 55 is not located above the bus bar pattern 37 (not on the peripheral thin portion of the flange shape of the conductive connection pattern 40 disposed on the bus bar pattern 37).

In some embodiments, the edge of the second opening 55 at the sides other than the side, on which the conductive connection pattern 40 is formed, of the island pattern 33 is located on the island pattern 33. The overlap amount D2 is in a range from about 0 nm to about 100 nm in some embodiments, and is in a range from about 20 nm to about 50 nm in other embodiments. If the amount D2 is less than 0 relative to a sidewall of the groove 38, a part of the groove 38 is exposed. If the amount D2 is too large, the effective volume of the bump structure would be smaller than the desired amount. In some embodiments, the second openings 55 are substantially circular having a diameter ranging from about 10 μm to about 50 μm.

Figure 7A:
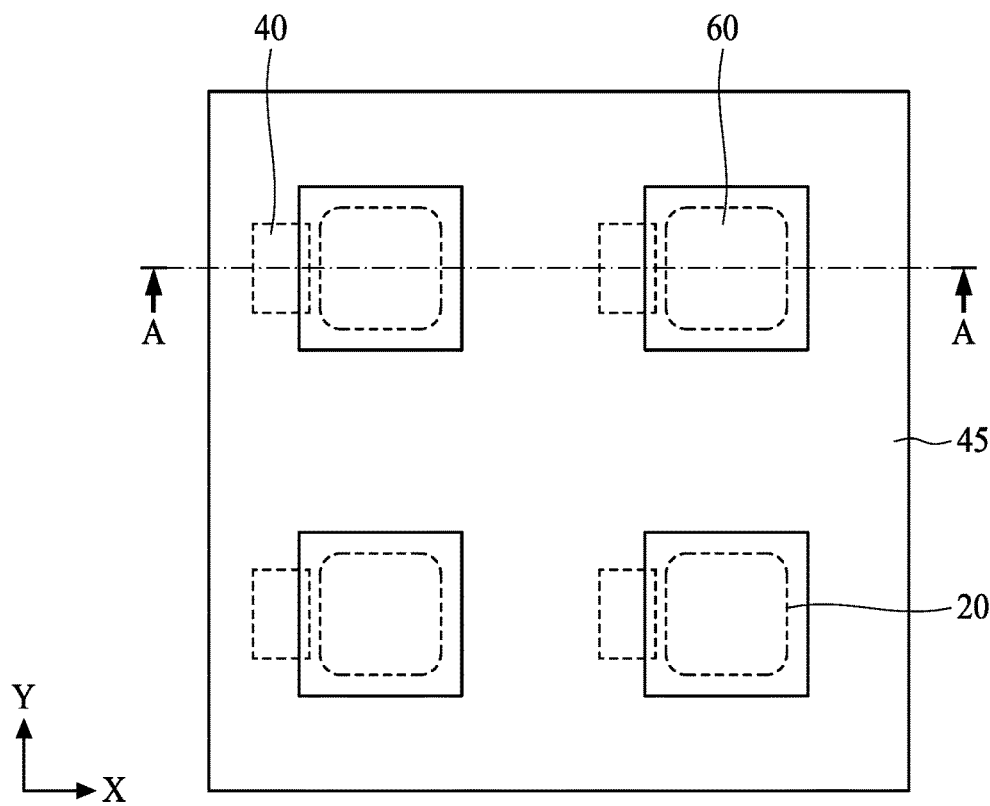
FIGS. 7A and 7B show one of the stages of a sequential manufacturing operation of a semiconductor device according to an embodiment of the present disclosure.
Figure 7B:
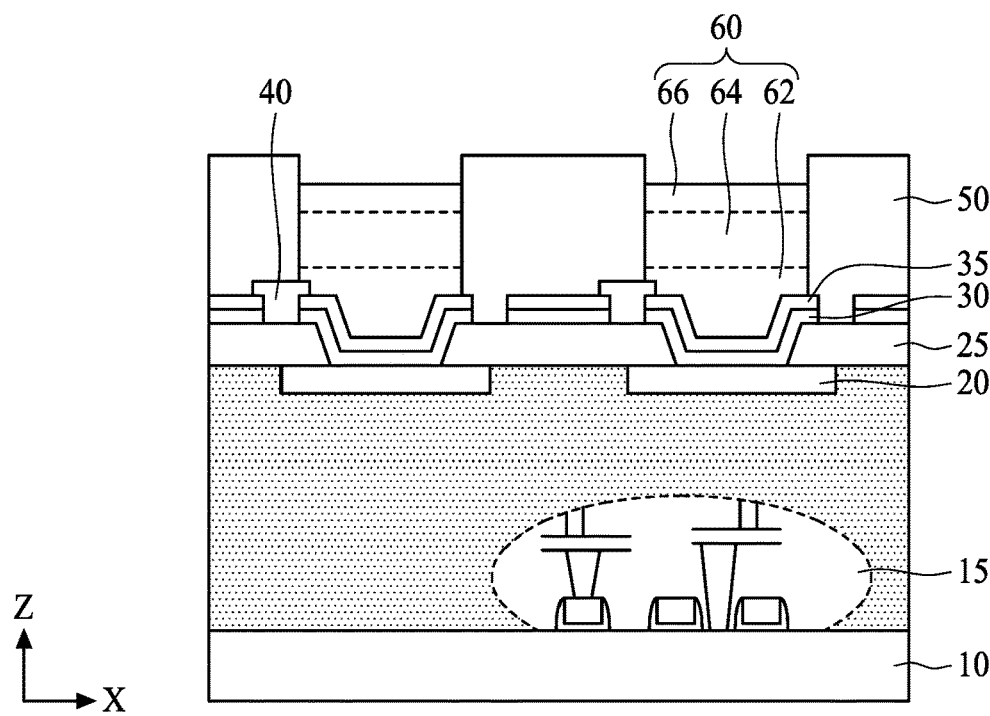

Next, as shown in FIGS. 7A and 7B, one or more conductive layers 60 are formed in the second openings 55. In some embodiments, the conductive layer 60 is a single layer of copper or a copper alloy. In some embodiments, the conductive layer 60 includes a first conductive layer 62, a second conductive layer 64 and a third conductive layer 66. In some embodiments, the conductive layer 60 includes gold or a gold alloy.

A first conductive layer 62 is formed in the second openings 55 over the island pattern 33 of the seed layer 35 in some embodiments. The first conductive layer 62 is copper or a copper alloy (e.g., AlCu) in some embodiments. The first conductive layer 62 may be formed by an electroplating process. In other embodiments, PVD including sputtering, CVD, ALD, thermal evaporation, and/or electron beam evaporation are employed. The first conductive layer 62 has a thickness in a range from about 5 μm to about 10 μm in some embodiments.

Further, a second conductive layer 64 is formed in the second openings 55 over the first conductive layer 62. In some embodiments, the second conductive layer 64 includes a metal having a lower solderability or wettability than copper or a copper alloy to a solder alloy.

In some embodiments, the thickness of the second conductive layer 64 is greater than the thickness of the first conductive layer 62 over the uppermost surface of the seed layer 35. In some embodiments, the thickness of the second conductive layer 64 is in a range from about 10 μm to about 30 μm. In some embodiments, a ratio of the thickness of the second conductive layer 64 to the thickness of the first conductive layer 62 ranges from about 6/1 to about 1.5/1.

In some embodiments, the second conductive layer 64 is formed mainly of a metal selected from the group consisting of aluminum, chromium, iron, manganese, magnesium, molybdenum, nickel, niobium, tantalum, titanium, tungsten, zinc, and alloys thereof. In some embodiments, the second conductive layer 64 is formed of a nickel-based material. In some embodiments, the nickel-based material includes nickel and nickel alloys containing 50 mol % or greater nickel. The second conductive layer 64 is formed by an electroplating process.

The third conductive layer 66 includes a solder layer in some embodiments. The solder layer 66 includes a eutectic solder, such as an alloy selected from the group consisting of AgSn, SnAgCu, PbSn, and CuSn in some embodiments. Other suitable solders may be used as long as the second conductive layer 64 has a lower solderability (wettability) to the solder than copper or copper alloys. The thickness of the solder layer 66 is about 2 µm to about 10 µm in some embodiments. In some embodiments, excess solder is removed from above the photoresist layer 55. In some embodiments, the Ni-based second conductive layer 64 is not formed, and the solder layer 66 is formed on the first conductive layer 62. In other embodiments, the first conductive layer 62 is not formed, and the Ni-based second conductive layer 64 is formed on the seed layer 35.

Since the plurality of island patterns 33 formed of the UBM layers are electrically connected to the bus bar pattern 37, which is in turn electrically connected to an electrode of the electroplating process, the conductive layers 62, 64 and 66 are selectively formed in the plurality of second openings 55.

Figure 8A:
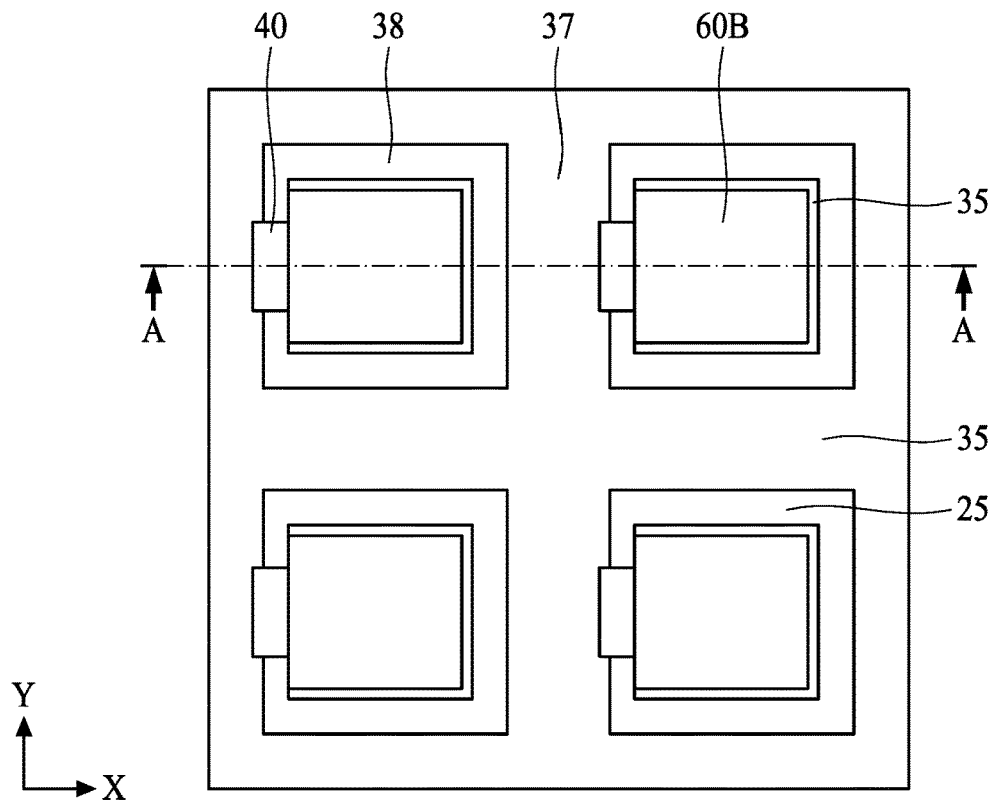
FIGS. 8A and 8B show one of the stages of a sequential manufacturing operation of a semiconductor device according to an embodiment of the present disclosure.
Figure 8B:
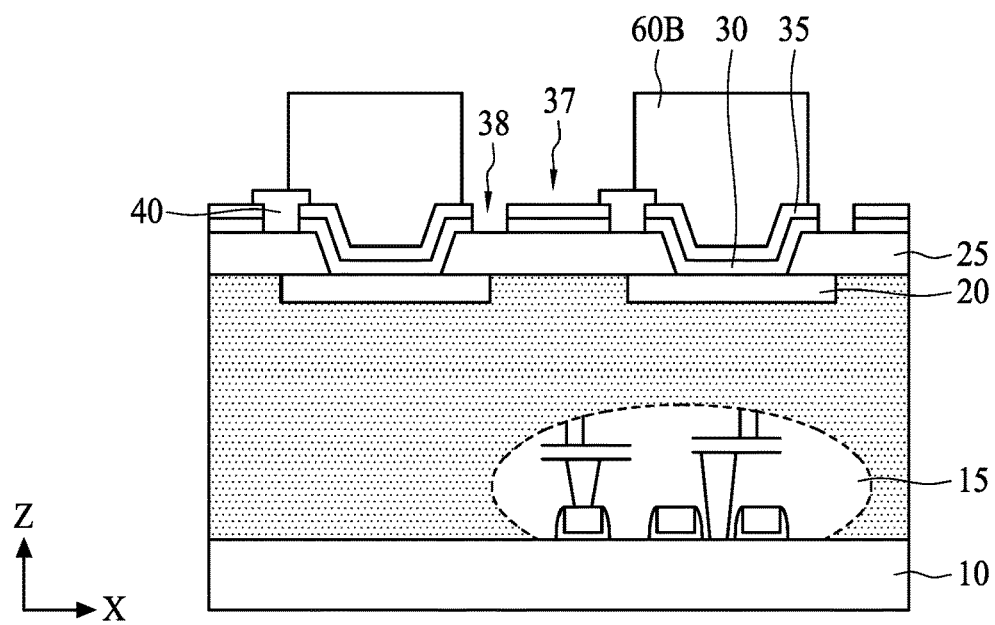

Subsequently, the photoresist layer 50 is removed, as shown in FIGS. 8A and 8B to expose the sidewalls of the solder layer 66, the second conductive layer 64, and the first conductive layer 62, thereby forming a bump structure 60B. The photoresist layer 50 is removed using a suitable photoresist stripper in some embodiments.

Figure 9A:
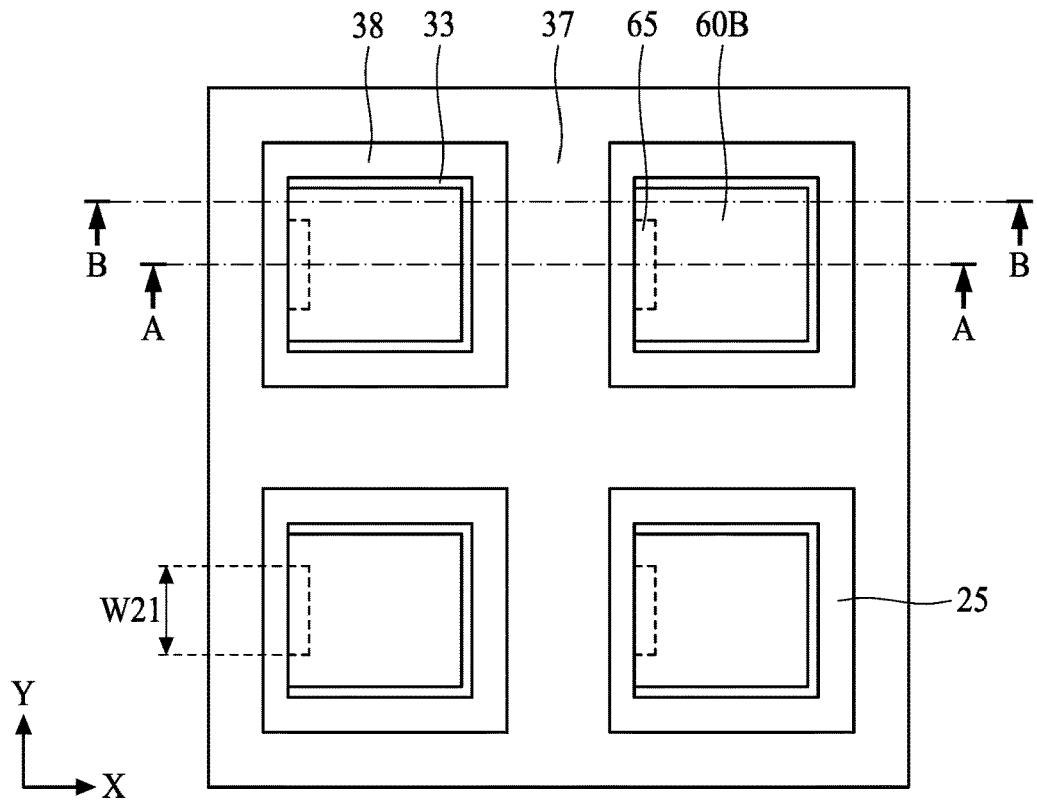
FIGS. 9A 9B, 9C, 9D, 9E and 9F show one of the stages of a sequential manufacturing operation of a semiconductor device according to embodiments of the present disclosure.
Figure 9B:
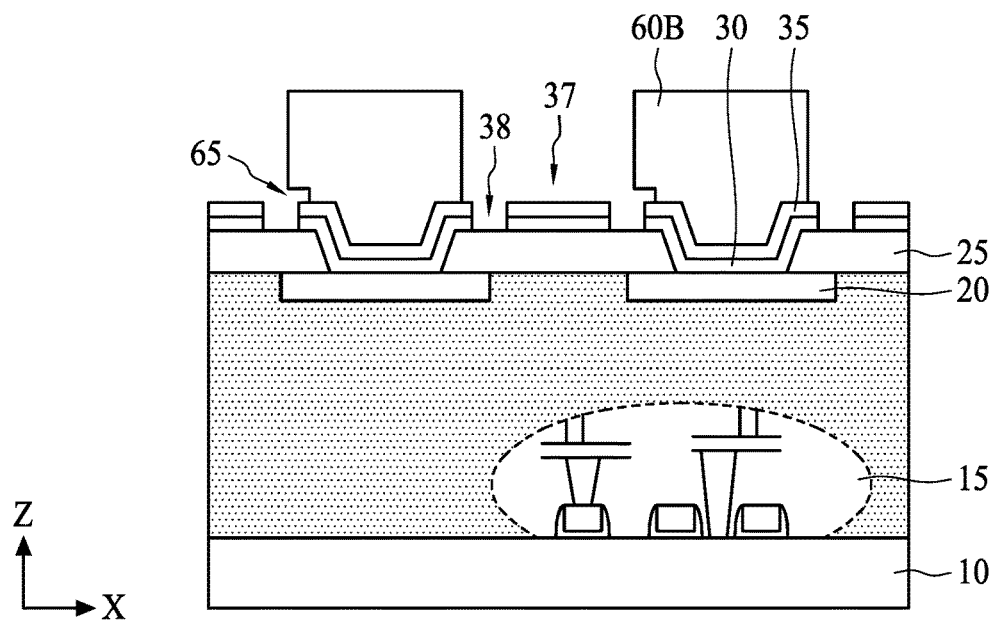

Next, as shown in FIGS. 9A and 9B, the conductive connection patterns 40 are removed by an etching operation using a suitable etchant for the conductive connection patterns 40 to be removed (etched) selective to the UBM layers 30, 35 and the bump structures 60B. In some embodiments, the etching operation is a wet etching operation. In some embodiments, when the conductive connection patterns 40 is an Au-based material (more than 90% of Au, Au alloy), the wet etchant includes KI (potassium iodine) and 12, which can etch the Au layer selective to the Cu layer and/or the Ti/Cu UBM layer.

In some embodiments, when the conductive connection patterns 40 is a Cu-based material (more than 90% of Cu, Cu alloy), the wet etchant includes $H_2SO_4$ (10-30 wt %)+$H_2O_2$ (5-15 wt %)+<1% organic additive (0.1-1 wt %), which can etch the Cu layer selective to the Au layer and/or the Ti/Au UBM layer. In some embodiments, when the conductive connection patterns 40 is an Al-based material (more than 90% of Al, Al alloy), the wet etchant includes $H_3PO_4$ (10-30 wt %)+$H_2O_2$ (5-15 wt %)+organic additive (0.1-1 wt %), which can etch the Al layer selective to the Cu layer and/or the Ti/Cu UBM layer.

In some embodiments, when the underlying conductive layer 30 is a Ti-based material (more than 90% of Ti, Ti alloy) and is necessary to be etched, the wet etchant includes $H_3PO_4$ (5-15 wt %)+$H_2O_2$ (5-15 wt %)+KOH (2-15 wt %)+organic additive (0.1-1 wt %), which can etch the Ti layer selective to the conductive connection patterns 40, the seed layer 35 the Au layer and/or bump structure 60B, which are made of Au, Cu and/or Al. By removing the conductive connection patterns 40, the bump structures 60B formed on the island patterns 33 are electrically isolated from each other. In some embodiments, after removal of the photoresist layer 50, the solder layer 66 is reflowed to form a smooth, hemispherical shape.

The etching operation produces an under-cut 65 caused by the removal of the conductive connection pattern 40, in particular, the thin peripheral portion of the flange shape of the conductive connection pattern 40.

Figure 9C:
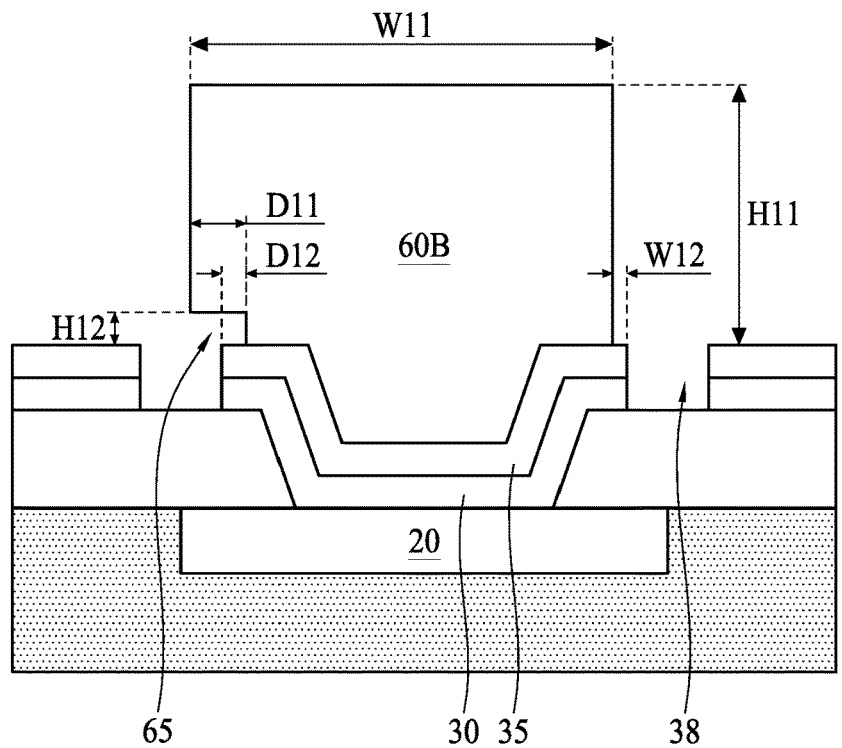

As shown in FIG. 9C, the width W11 of the bump structure 60B is in a range from about 10 µm to about 500 µm, and is in a range from about 20 µm to about 100 µm in other embodiments. The height of the bump structure 60B from the uppermost portion of the seed layer 35 is in a range from about 17 µm to about 30 µm in some embodiments. As shown in FIG. 9A, the width along the Y direction (along the side of the bump structure 60B) is in a range from about 200 nm to about 200 µm in some embodiments.

Figure 9D:
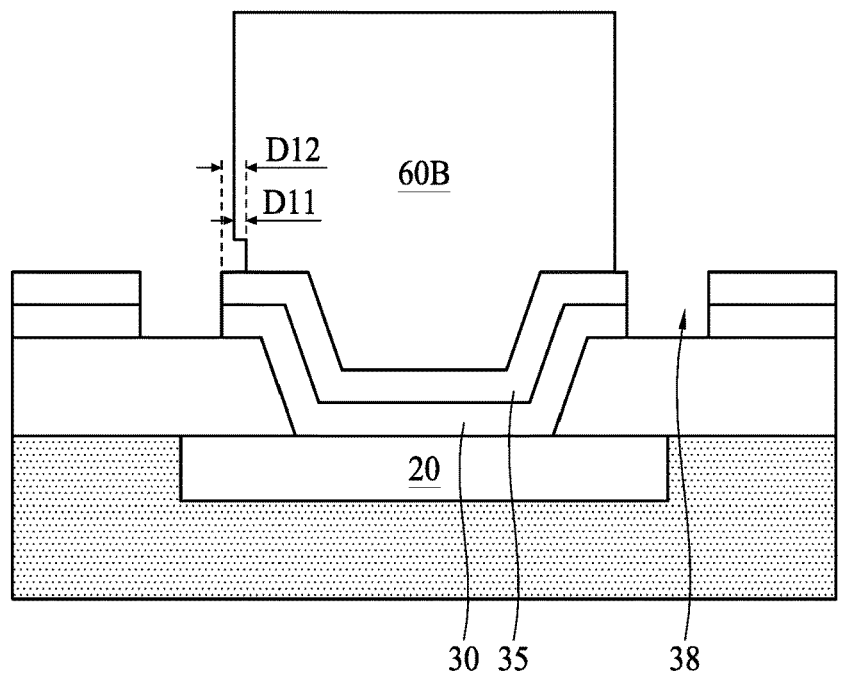

In some embodiments, the lateral depth D11 of the under-cut 65 from the side of the bump structure 60B is in a range from about 0 nm to about 500 nm and is in a range from about 50 nm to about 200 nm in other embodiments. In some embodiments, the lateral depth D12 of the under-cut 65 from the edge of the groove 38 is in a range from about 50 nm about 200 nm. In some embodiments, at part of the island pattern 33 on which no conductive connection pattern 40 is formed, the bump structure 60B has an offset W12 from the edge of the groove 38. In some embodiments, the offset W12 is in a range from about 0 nm to about 100 nm in some embodiments, and is in a range from about 20 nm to about 50 nm in other embodiments. In some embodiments, the lateral depth D11 is greater than the lateral depth D12, as shown in FIG. 9C. In some embodiments, the lateral depth D11 is equal to the lateral depth D12. In other embodiments, the lateral depth D11 is smaller than the lateral depth D12 as shown in FIG. 9D. In some embodiments, the height H12 of the under-cut 65 is in a range from about 200 nm to about 500 nm.

Figure 9E:
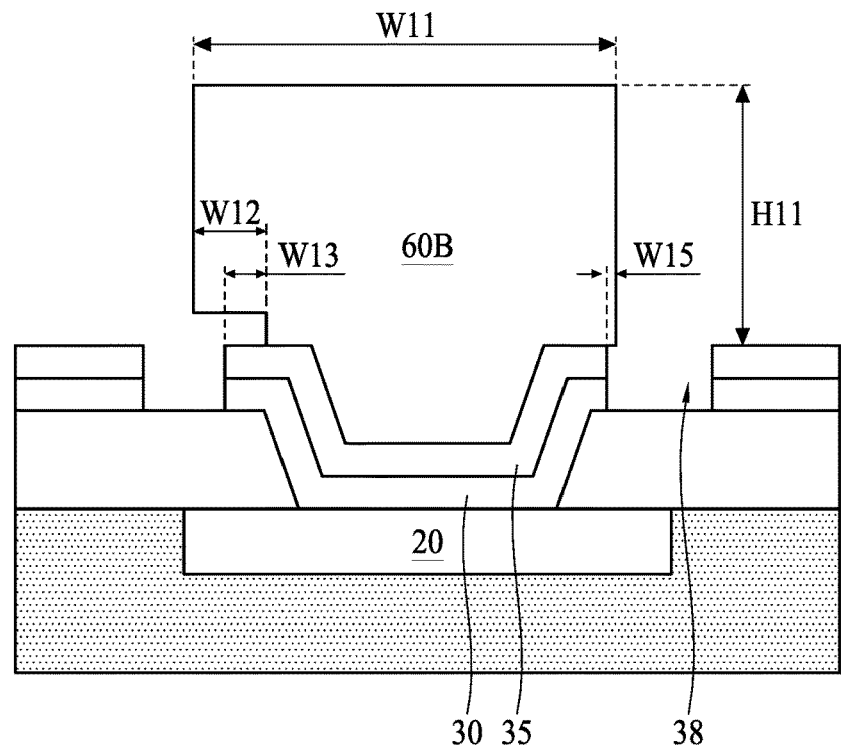

In some embodiments, depending on the etching selectivity between the UBM layer and the conductive connection layer 40, a part of the UBM layer is slightly etched. In such a case, the bump structure 60B has an overhang shape at part of the island pattern 33 on which no conductive connection pattern 40 is formed, as shown in FIG. 9E. The offset amount W15 is more than 0 nm to about 50 nm in some embodiments.

Figure 9F:
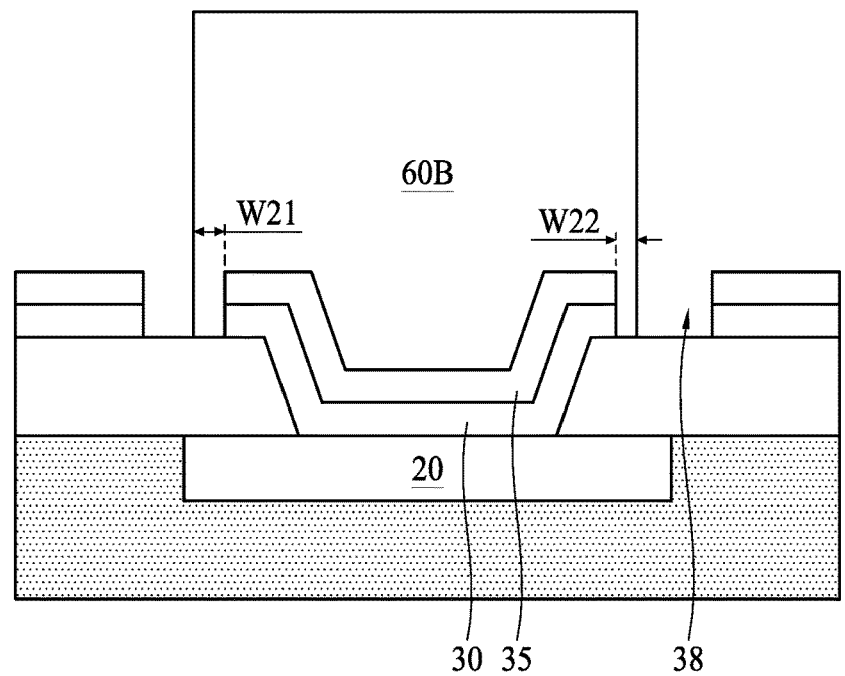

FIG. 9F shows a cross sectional view along line B-B of FIG. 9A of a bump structure 60B according to an embodiment of the present disclosure. When the edge of the second opening 55 is located in the groove 38, the bump structure 60B, in particular, the first conductive layer 62, covers the side edges of the UBM layers 30 and 35, as shown in FIG. 9F. In some embodiments, the thickness W21 of one side is equal to or different from the thickness W22 of the other side depending on an overlay error of the photoresist layer 50 (the second openings 55) with respect to the island patterns 33.

As shown in FIGS. 9A-9F, the under-cut 65 is only partially formed on the side face of the bump structure 60B. When the bump structure 60B has a substantially rectangular (e.g., square) shape in plan view, the under-cut 65 is formed at only one side and the remaining sides have no under-cut. Thus, the under-cut is asymmetrically formed with respect to the center of the bump structure 60B. In the above embodiments, the location of the under-cut is limited and an amount of the under-cut is controllable. Further, the UBM layers are not substantially etched after the bump structures are formed. Thus, it is possible to prevent collapse of the bump structures due to over etching of the UBM layers.

In some embodiments, the second photoresist layer 50 is formed such that no part of the conductive connection pattern 40 is exposed in the second opening 55. In other words, the photoresist pattern 50 fully covers the conductive connection patterns 40. In such a case, substantially no under-cut is formed in the bump structure 60B and the UBM layers (see, FIGS. 13A and 13B below).

FIGS. 10A-10E show various configurations of the conductive connection patterns.

Figure 10A:
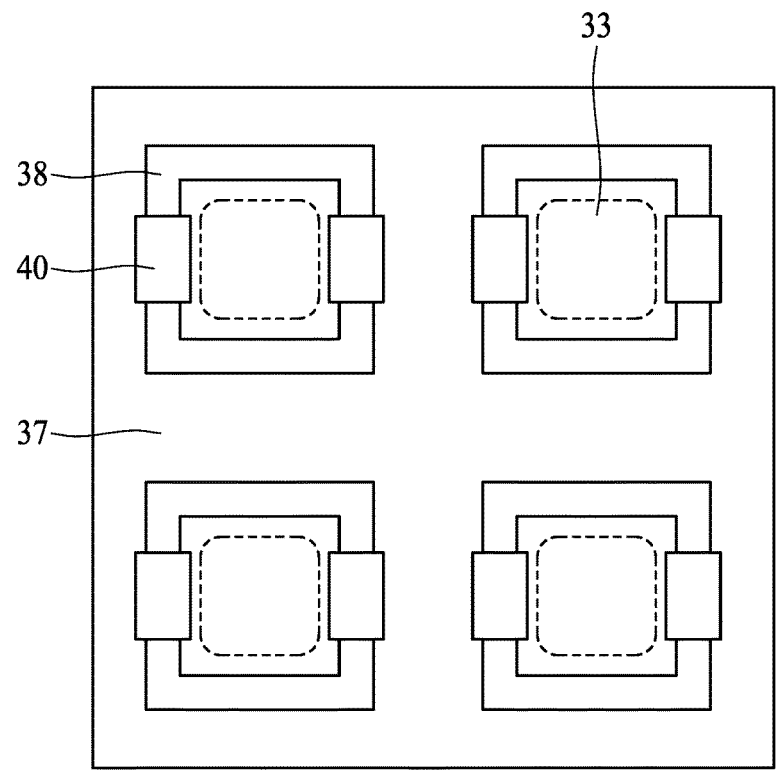
FIGS. 10A 10B, 10C, 10D and 10E show various configuration of conductive connection pattern according to embodiments of the present disclosure.

In some embodiments, as shown in FIG. 10A, two or more conductive connection patterns 40 are provided for one island pattern 33 having a rectangular shape (with rounded corners), at two or more sides of the rectangular shape. In such a case, the under-cut 65 may be formed at symmetrical locations (at two or four sides).

Figure 10B:
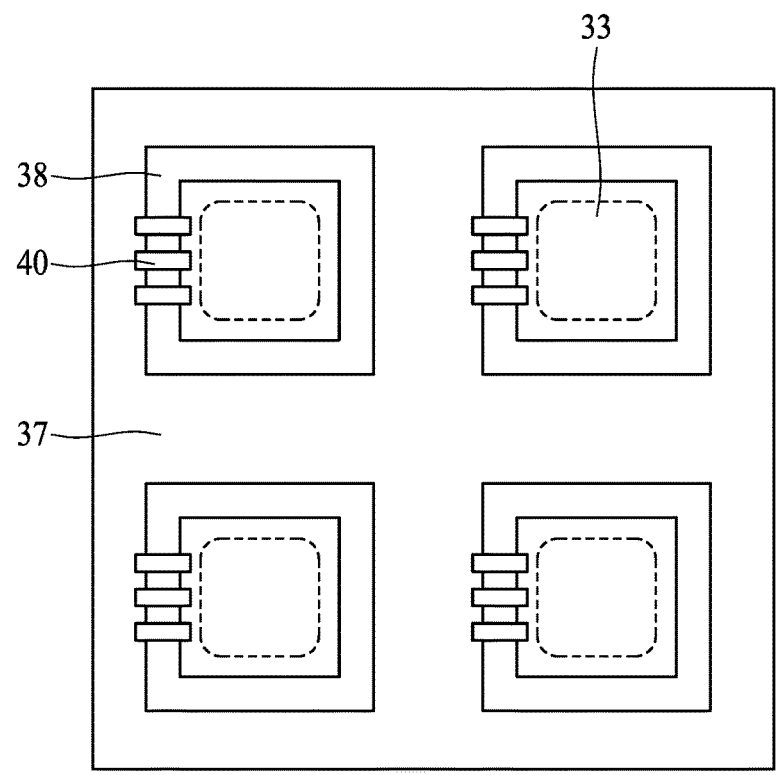

In some embodiments, as shown in FIG. 10B, two or more conductive connection patterns 40 are provided for one island pattern 33 having a rectangular shape at one side of the rectangular shape.

Figure 10C:
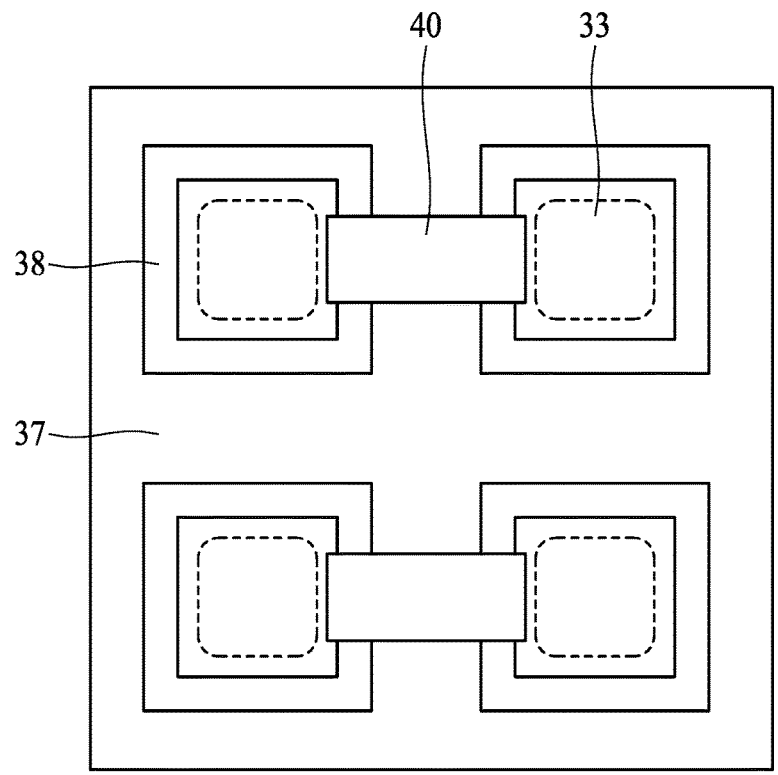

In some embodiments, as shown in FIG. 10C, a conductive connection pattern 40 is provided for two adjacent island patterns 33.

Figure 10D:
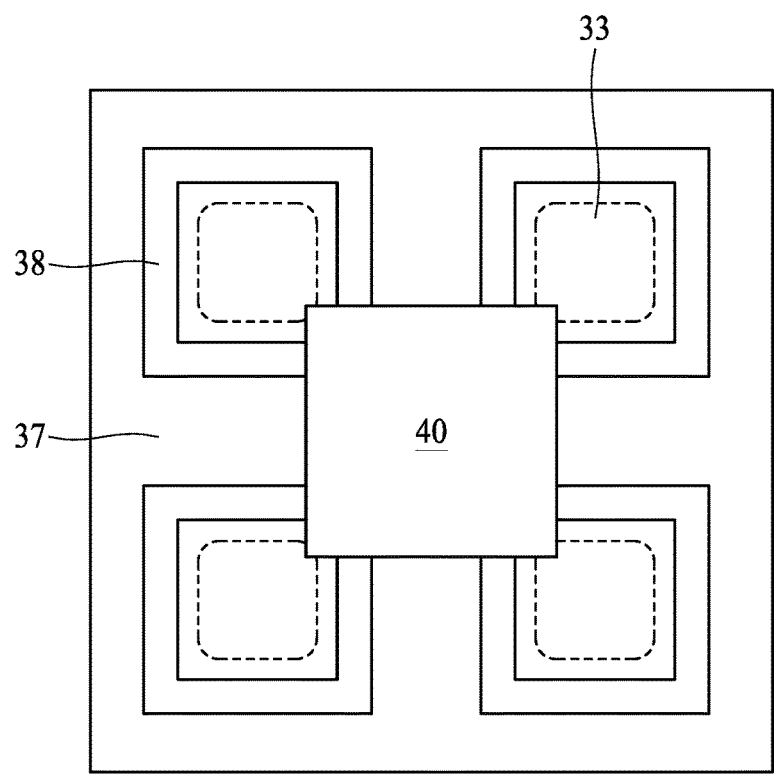
Figure 10E:
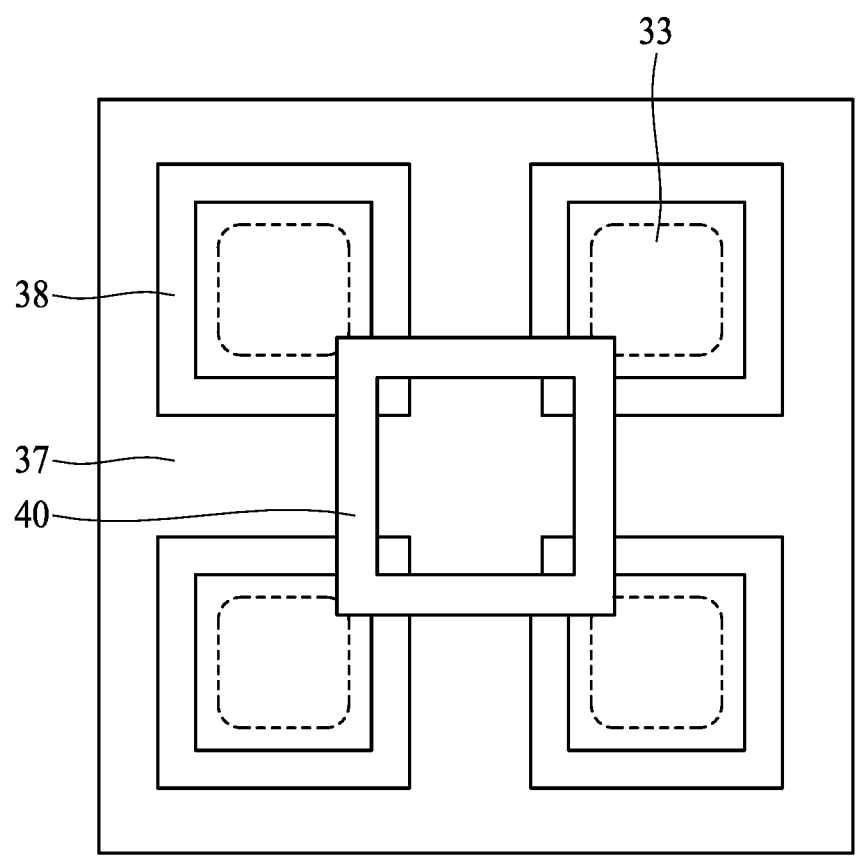

In other embodiments, as shown in FIG. 10D, a conductive connection pattern 40 is provided for four adjacent island patterns 33. In some embodiments, as shown in FIG. 10E, the conductive connection pattern 40 has a ring or a frame shape. In these cases, the under-cut 65 is formed at a corner of the bump structure when the bump structure has a substantially rectangular shape (with rounded corners).

In some embodiments, at least one of the island pattern 33 or the bump structure 60B has a circular shape in plan view. One or more under-cuts 65 are formed between the bump structure and the seed layer 45 of the island pattern of the UBM layers in some embodiments.

FIGS. 11A and 11B to 15 show various views a sequential manufacturing operation of a bump structure over a semiconductor circuit according to an embodiment of the present disclosure. It is understood that additional operations can be provided before, during, and after processes shown by FIGS. 11A-15, and some of the operations described below can be replaced or eliminated, for additional embodiments of the method. The order of the operations/processes may be interchangeable. Materials, process, configurations and/or processes described with respect to the forgoing embodiments are employed in the following embodiments, and detailed description thereof may be omitted.

Figure 11A:
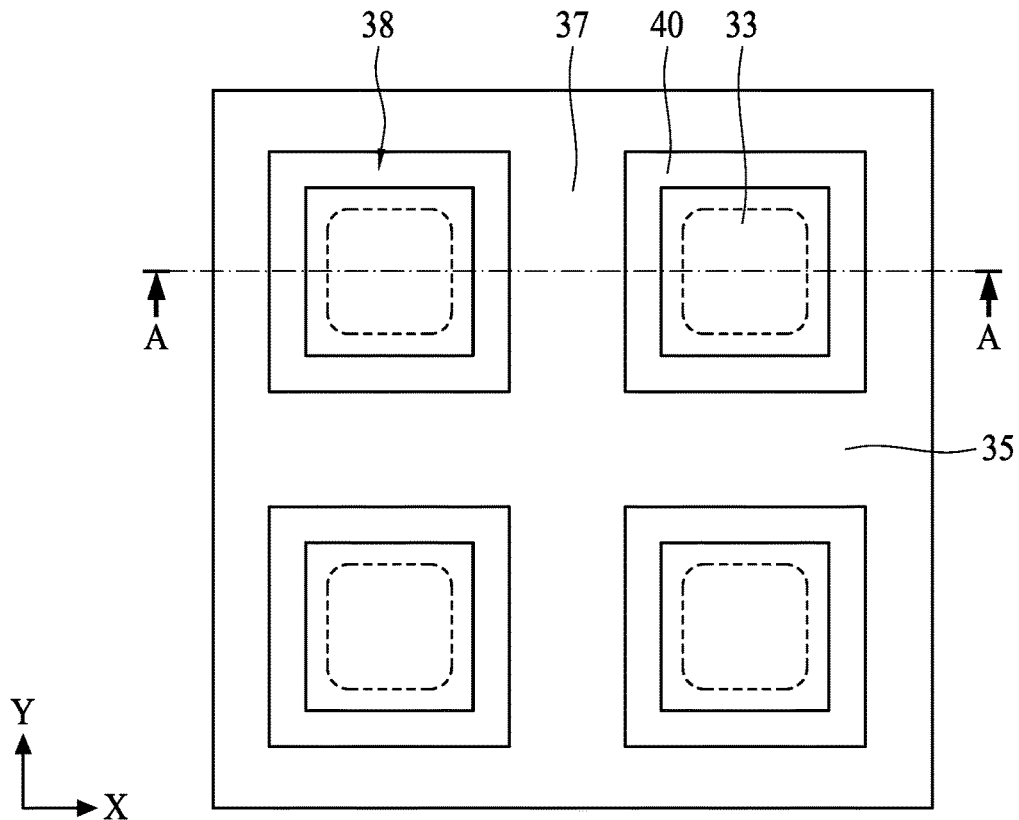
FIGS. 11A and 11B show one of the stages of a sequential manufacturing operation of a semiconductor device according to an embodiment of the present disclosure.
Figure 11B:
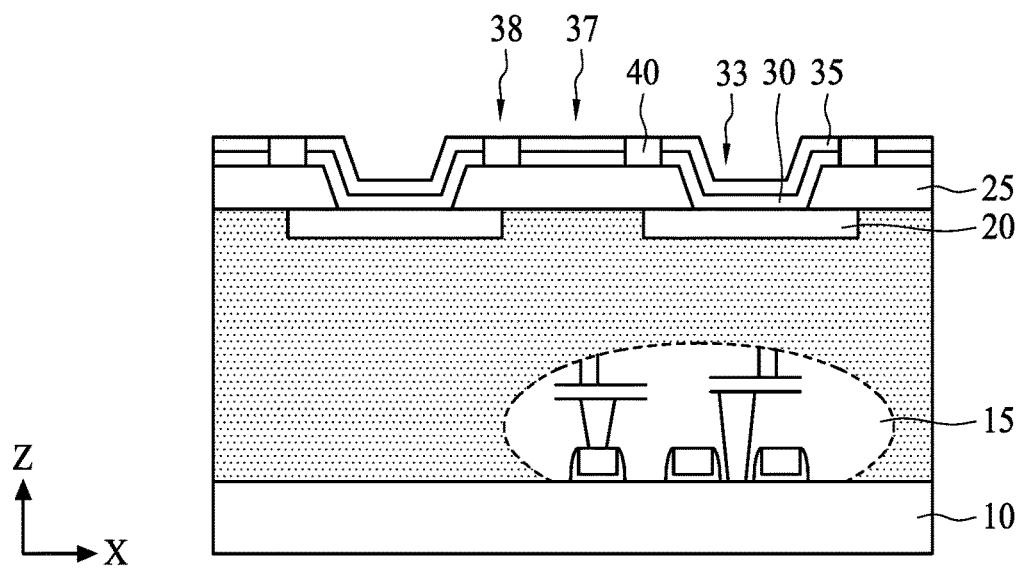

In some embodiments, as shown in FIGS. 11A and 11B, the conductive connection patterns 40 fully fill the grooves 38. In some embodiments, the conductive connection patterns 40 do not have a flange shape (H1=0 in FIG. 5B), and the upper surface of the conductive connection patterns 40 are substantially flush with the upper surface of the seed layer 35. In some embodiments, after the structure shown in FIGS. 5A and 5B is formed, one or more planarization operations, such as an etch-back operation or a chemical mechanical polishing (CMP) operation, are performed.

Figure 11C:
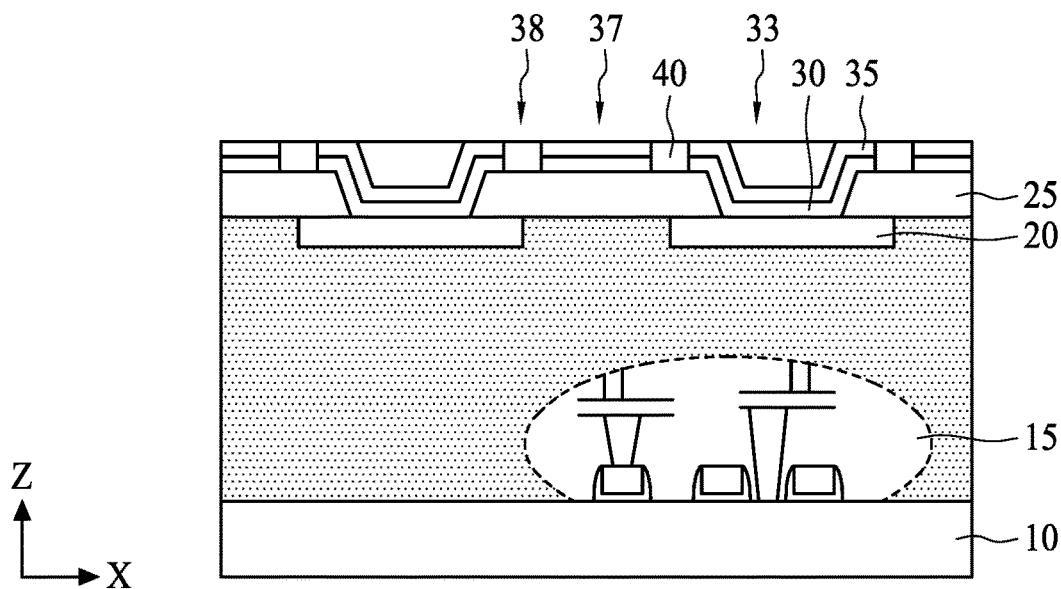
FIGS. 11C and 11D show one of the stages of a sequential manufacturing operation of a semiconductor device according to an embodiment of the present disclosure.
Figure 11D:
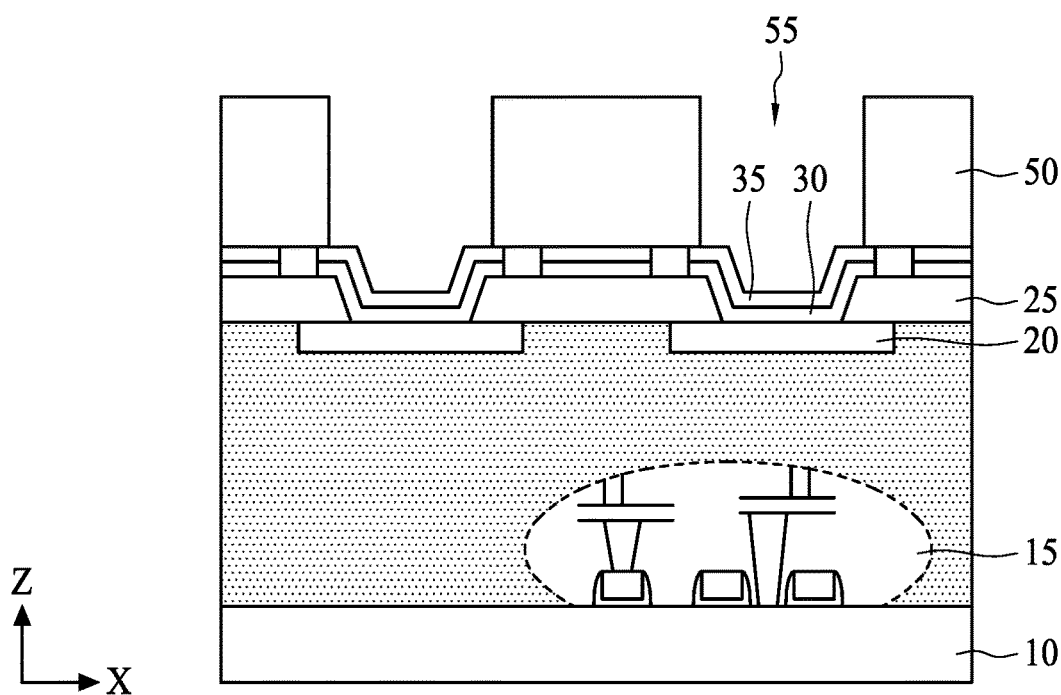

Then, a photoresist pattern 50 having second openings 55 is formed, as shown in FIG. 11D. In some embodiments, the size of the second opening 55 is smaller than the size of the island pattern 33 of the UBM layers, and a periphery of the second opening 55 is fully disposed over the island pattern 33. Thus, the conductive connection patterns are fully covered by the photoresist pattern 50.

In some embodiments, the connection conductive patterns 40 are formed without a photo lithography process. In some embodiments, a blanket layer of a conductive material for the connection conductive patterns 40 is formed over the structure shown in FIGS. 4A and 4B, and then, a planarization operation, such as a CMP operation, is performed. As shown in FIG. 11C, the conductive material remains not only in the grooves 38 but also in a recessed or convex portion of the island pattern 33. Then, a second photoresist pattern 50 having second openings 55 is formed. As shown in FIG. 11D, the remaining conductive material in the recessed or convex portion of the island pattern 33 is removed by a suitable etching operation through the second openings 55. In some embodiments, a wet etching is performed to remove the conductive material selective to the seed layer 35. In some embodiments, when the volume of the remaining conductive material in the recessed or convex portion of the island pattern 33 is sufficiently small and the exposed seed layer in the second opening 55 is sufficiently large, the remaining conductive material in the recessed or convex portion of the island pattern 33 is not removed.

Figure 12A:
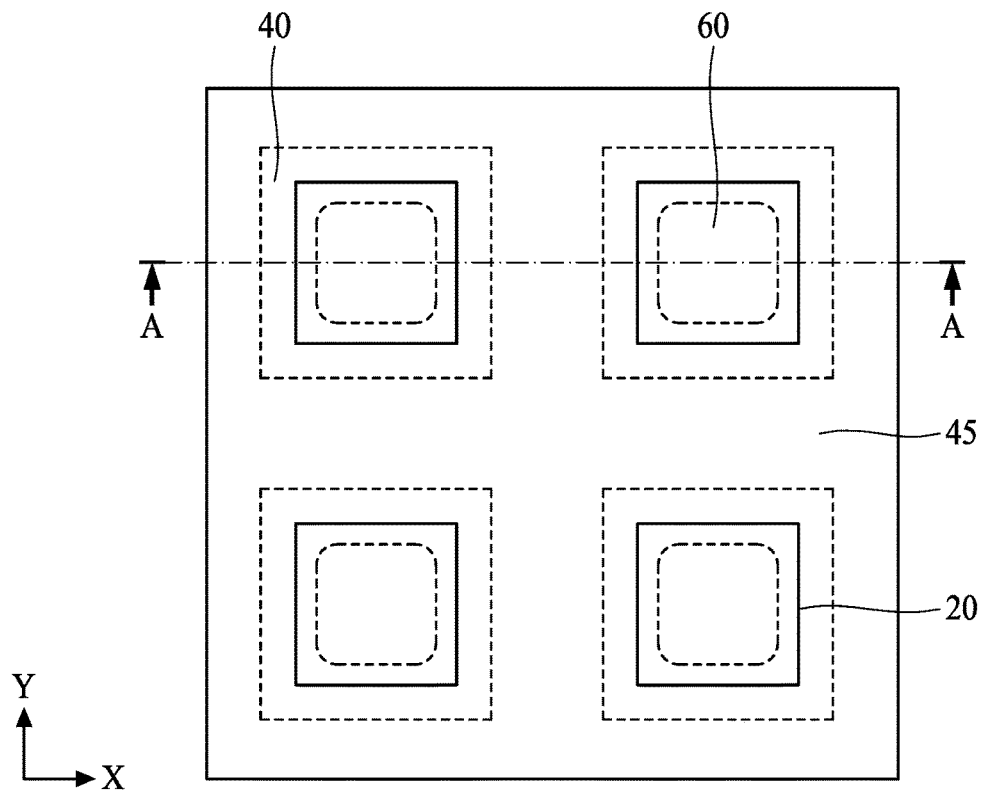
FIGS. 12A and 12B show one of the stages of a sequential manufacturing operation of a semiconductor device according to an embodiment of the present disclosure.
Figure 12B:
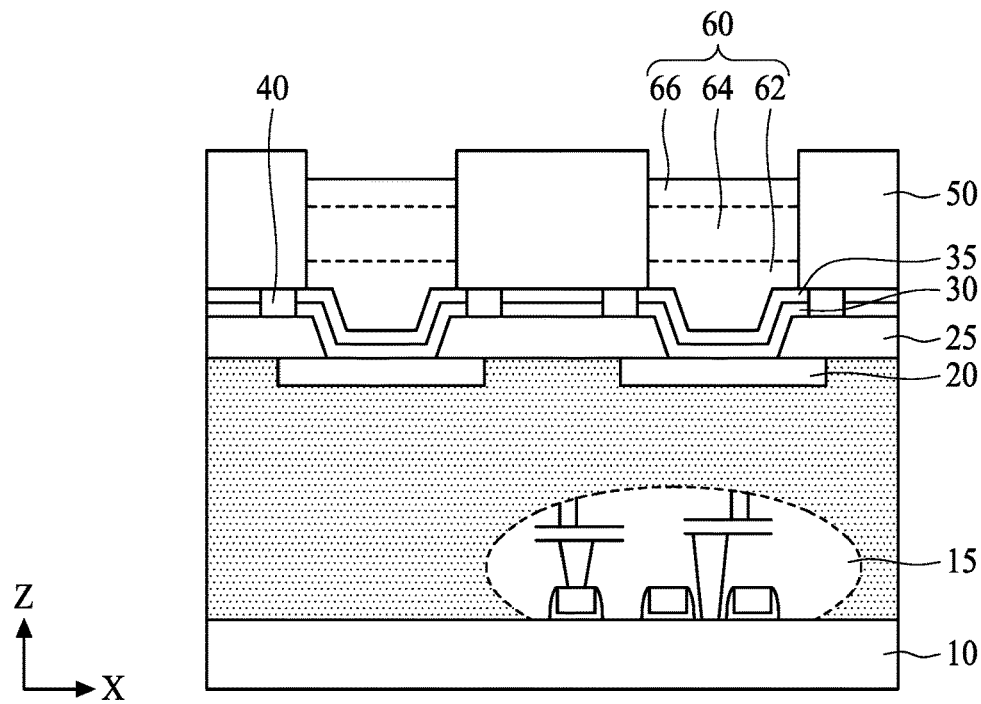

Next, as shown in FIGS. 12A and 12B, one or more conductive layers 60 are formed in the second openings 55 similar to the operation as explained with respect to FIGS. 7A and 7B. Since the island patterns 33 are electrically connected to the bus bar pattern 37, the conductive layers 60 are formed by one or more electroplating processes.

Figure 13A:
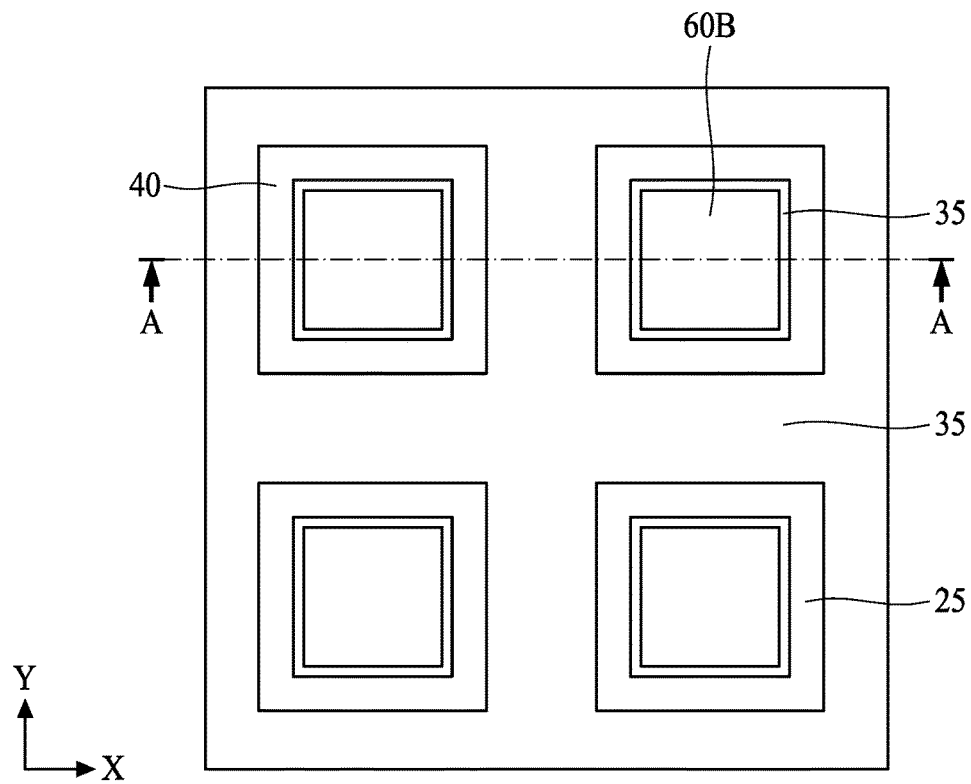
FIGS. 13A and 13B show one of the stages of a sequential manufacturing operation of a semiconductor device according to an embodiment of the present disclosure.
Figure 13B:
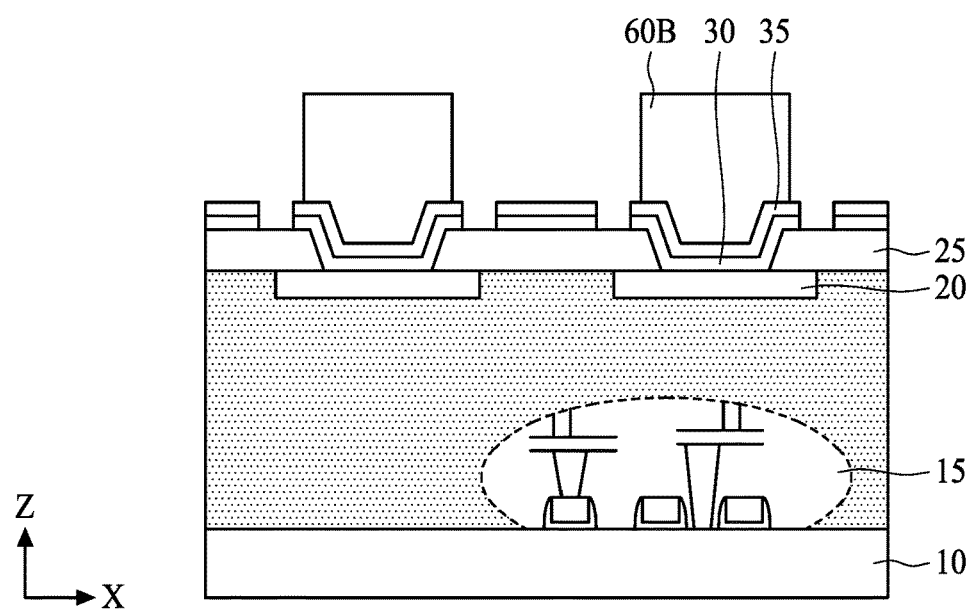

Then, the second photoresist layer 50 is removed, and then the conductive connection patterns 40 are removed by using a suitable etching operation, as shown in FIGS. 13A and 13B. In some embodiments, the conductive connection patterns 40 are removed by wet etching selective to the UBM layers and the bump structures 60B.

As shown in FIGS. 13A and 13B, substantially no under-cut is formed in the bump structure 60B and the UBM layers. When viewed from above, the bump structure 60B is surrounded by the seed layer 35.

In some embodiments, a photoresist pattern 50 is formed such that the size of the second opening 55 is greater than the size of the island pattern 33 of the UBM layers, and a periphery of the second opening 55 is fully or partially disposed over the conductive connection pattern 40 having a ring or frame shape. Thus, the conductive connection patterns are only partially covered by the photoresist pattern 50.

Figure 14:
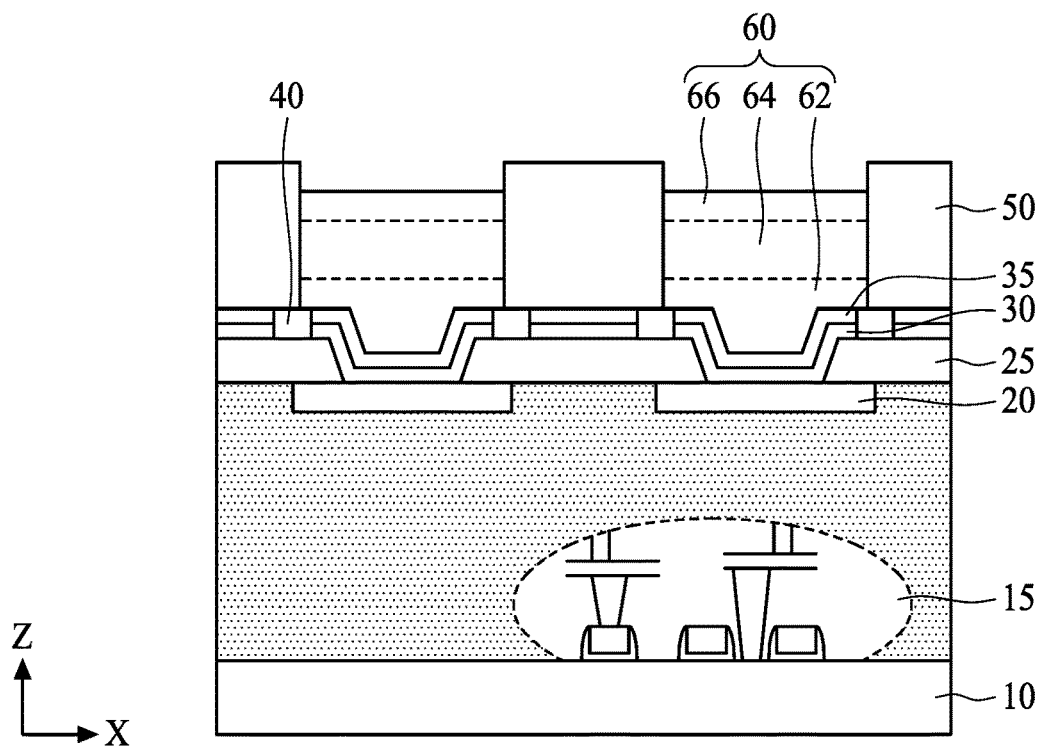
FIG. 14 is a cross-sectional view of one of the stages of a sequential manufacturing operation of a semiconductor device according to an embodiment of the present disclosure.
Figure 15:
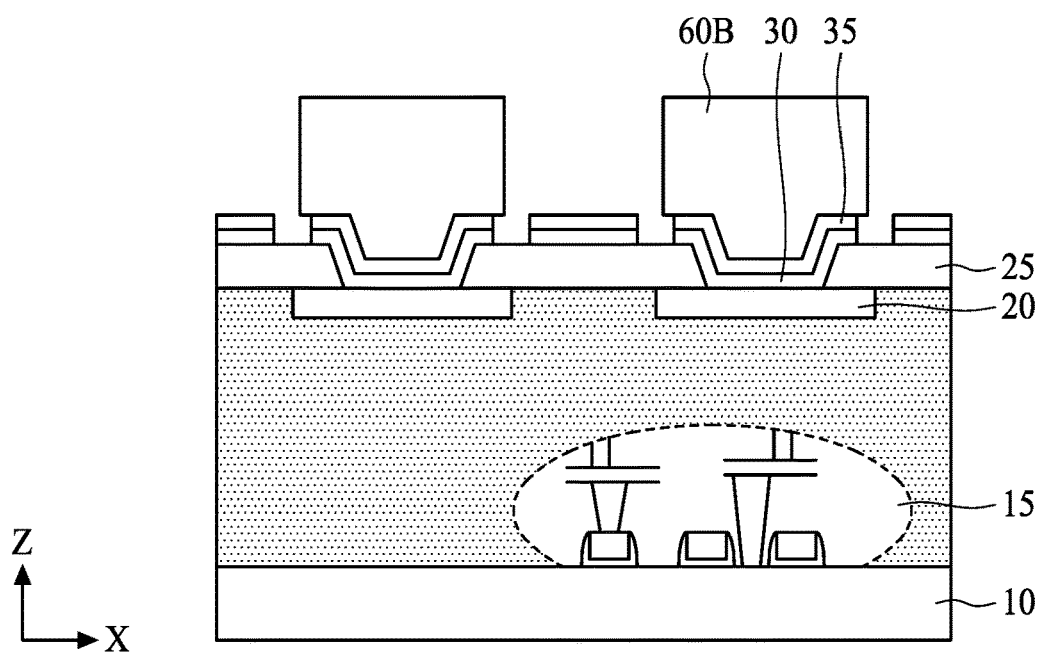
FIG. 15 is a cross-sectional view of one of the stages of a sequential manufacturing operation of a semiconductor device according to an embodiment of the present disclosure.

Next, as shown in FIG. 14, one or more conductive layers 60 are formed in the second openings 55 similar to the operation as explained with respect to FIGS. 7A and 7B. The second photoresist layer 50 is subsequently removed, and then the conductive connection patterns 40 are removed by using a suitable etching operation, as shown in FIG. 15. In some embodiments, the conductive connection patterns 40 are removed by wet etching selective to the UBM layers and the bump structures 60B.

As shown in FIG. 15, an under-cut is formed in the UBM layers surrounding the bump structure 60B. However, the amount of the under-cut is controlled by the overlap amount of the second opening 50 and the conductive connection pattern 40. Accordingly, it is possible to present undesirable collapse of the bump structures 60 due to over-etching of the UBM layers.

In some embodiments, a part of the periphery of the second opening 55 of the second photoresist pattern 50 is located over the island pattern 33 and a part of the periphery of the second opening 55 of the second photoresist pattern 50 is located over the conductive connection pattern 40. In such case, an asymmetric under-cut is formed in the UBM layers.

Bump undercut as a result of under bump metallization etching after formation of the bump may result in bump collapse. In embodiments of the present disclosure, the bump structure is formed after the under bump metallization etching operation. Embodiments of the disclosure provide an asymmetric undercut surrounding the bump structure. Embodiments of the disclosure provide high aspect ratio bumps and fine pitch structure coupled with reduced bump collapse defects.

It will be understood that not all advantages have been necessarily discussed herein, no particular advantage is required for all embodiments or examples, and other embodiments or examples may offer different advantages.

In accordance with an aspect of the present disclosure, in a method of manufacturing a semiconductor device, one or more first conductive layers are formed over a substrate. A first photoresist layer is formed over the one or more first conductive layers. The one or more first conductive layers are etched by using the first photoresist layer as an etching mask, to form an island pattern of the one or more first conductive layers separated from a bus bar pattern of the one or more first conductive layers by a ring shape groove. A connection pattern is formed to connect the island pattern and the bus bar pattern. A second photoresist layer is formed over the one or more first conductive layers and the connection pattern. The second photoresist layer includes an opening over the island pattern. One or more second conductive layers are formed on the island pattern in the opening. The second photoresist layer is removed, and the connection pattern is removed, thereby forming a bump structure. In one or more of the foregoing or following embodiments, the connection pattern is made of a conductive material different from the one or more first conductive layers and the one or more second conductive layers. In one or more of the foregoing or following embodiments, the connection pattern only partially fills the ring shape groove to connect the island pattern and the bus bar pattern. In one or more of the foregoing or following embodiments, the connection pattern is formed in a part of the ring shape groove and on a part of an upper surface of an uppermost layer of the one or more first conductive layers. In one or more of the foregoing or following embodiments, a part of the connection pattern is disposed in the opening. In one or more of the foregoing or following embodiments, the connection pattern is removed by wet etching. In one or more of the foregoing or following embodiments, after the connection pattern is removed, the bump structure includes an under-cut between the bump structure and an uppermost layer of the one or more first conductive layers. In one or more of the foregoing or following embodiments, the undercut is only partially formed and no under-cut is formed at a remaining part between the bump structure and the uppermost layer of the one or more first conductive layers.

In accordance with another aspect of the present disclosure, in a method of fabricating a semiconductor device, a pad electrode coupled to a semiconductor circuit formed over a substrate is formed. A passivation layer is formed over the pad electrode. The passivation layer is patterned to expose at least a part of the pad electrode. A seed layer is formed over the passivation layer and the pad electrode. The seed layer is patterned to form an island pattern of the seed layer electrically separated from a bus bar pattern of the seed layer by a ring shape groove. A connection pattern is formed to electrically connect the island pattern and the bus bar pattern. A photoresist layer is formed over the seed layer and the connection pattern. The photoresist layer includes an opening over the island pattern. One or more conductive layers are formed on the island pattern in the opening. The photoresist layer is removed, and the connection pattern is removed, thereby forming a bump structure. In one or more of the foregoing or following embodiments, at least one of the one or more conductive layers is formed by an electroplating process. In one or more of the foregoing or following embodiments, the bus bar pattern is electrically connected to a potential in the electroplating process. In one or more of the foregoing or following embodiments, the seed layer includes copper or a copper alloy. In one or more of the foregoing or following embodiments, the at least one of the one or more conductive layers includes copper or a copper alloy. In one or more of the foregoing or following embodiments, an underlying conductive layer is formed over the passivation layer and the pad electrode, before forming the seed layer. In one or more of the foregoing or following embodiments, the underlying conductive layer includes at least one selected from the group consisting of a titanium-based metal, a gold-based metal, and a copper-based metal. In one or more of the foregoing or following embodiments, the connection pattern includes at least one selected from the group consisting of Al, Au, Cr, Fe, Mn, Mg, Mo, Ni, Nb, Ta, Ti, W, Zn, and alloys thereof.

In accordance with another aspect of the present disclosure, in a method of fabricating a semiconductor device, a plurality of pad electrodes each coupled to a semiconductor circuit formed over a substrate are formed. A passivation layer is formed over the plurality of pad electrodes. The passivation layer is patterned to expose at least a part of each of the plurality of pad electrodes. A first conductive layer is formed over the passivation layer and the plurality of pad electrode. A seed layer is formed over the first conductive layer. The seed layer and the first conductive layer are patterned to form a plurality of island patterns of the seed layer and the first conductive layer electrically separated from each other a bus bar pattern of the seed layer and the first conductive layer by a plurality of ring shape grooves surrounding a corresponding one of the plurality of island patterns. A plurality of connection patterns are formed to electrically connect the plurality of island patterns and the bus bar pattern, respectively. A photoresist layer is formed over the seed layer and the plurality of connection patterns. The photoresist layer includes a plurality of openings over the plurality of island patterns. One or more second conductive layers are formed on the plurality of island patterns in the plurality of openings. The photoresist layer is removed, and the plurality of connection patterns are removed, thereby forming a plurality of bump structures over the plurality of pad electrodes. In one or more of the foregoing or following embodiments, at least one of the one or more second conductive layers is formed by an electroplating process. In one or more of the foregoing or following embodiments, the plurality of connection patterns are made of a conductive material different from the seed layer, the first conductive layer and the one or more second conductive layers. In one or more of the foregoing or following embodiments, a part of each of the plurality of connection patterns is disposed in a corresponding one of the plurality of openings, and a lowermost layer of the one or more second conductive layers is in contact with the part of each of the plurality of connection patterns.

In accordance with another aspect of the present disclosure, in a method of fabricating a semiconductor device, an under bump metallization layer is formed over a substrate. A first photoresist layer is formed over the under bump metallization layer. The photoresist layer is patterned to form a first opening exposing a first portion of the under bump metallization layer. The under bump metallization layer is patterned to extend the first opening to expose the substrate. The first photoresist layer is removed. A first metal is deposited in the first opening to form a first metal layer. A second photoresist layer is formed over the under bump metallization layer and the first metal layer. The second photoresist layer is patterned to form a second opening over the under bump metallization layer. The second opening exposes a portion of first metal layer. A second metal is deposited in the second opening to form a second metal layer. The second metal layer contacts the under bump metallization layer and the first metal layer. The second photoresist layer is removed, and the first metal layer is removed. In one or more of the foregoing or following embodiments, the patterning the first photoresist layer includes forming a third opening spaced apart from the first opening exposing a second portion of the under bump metallization layer. In one or more of the foregoing or following embodiments, the etching under bump metallization layer includes extending the third opening to expose the substrate. In one or more of the foregoing or following embodiments, the second opening is disposed between the first opening and the third opening. In one or more of the foregoing or following embodiments, the removing the first photoresist layer and the removing the second layer is performed using a stripper solution or an oxygen plasma ashing operation. In one or more of the foregoing or following embodiments, in the forming the under bump metallization, a first under bump metallization layer is formed over the substrate, and a second under bump metallization layer is formed over the first under bump metallization layer. In one or more of the foregoing or following embodiments, the first and second under bump metallization layers are made of a metal selected from the group consisting of a titanium-based metal, a gold-based metal, and a copper-based metal. In one or more of the foregoing or following embodiments, the first under bump metallization layer is made of a titanium-based metal, and the second under bump metallization layer is made of a gold-based metal. In one or more of the foregoing or following embodiments, the under bump metallization surrounding the second metal layer is removed after the removing the first metal layer. In one or more of the foregoing or following embodiments, the second metal layer is a bump. In one or more of the foregoing or following embodiments, the first metal and the second metal are different metals. In one or more of the foregoing or following embodiments, the first metal is selected from the group consisting of Ti, Cu, and combinations thereof. In one or more of the foregoing or following embodiments, the second metal is selected from the group consisting of Al, Au, Cr, Fe, Mn, Mg, Mo, Ni, Nb, Ta, Ti, W, Zn, and alloys thereof. In one or more of the foregoing or following embodiments, a solder layer is formed over the second metal layer. In one or more of the foregoing or following embodiments, the solder is a tin alloy. In one or more of the foregoing or following embodiments, the tin alloy is selected from the group consisting of AgSn, SnAgCu, PbSn, and CuSn.

In accordance with another aspect of the present disclosure, a semiconductor device includes a semiconductor circuit disposed over a substrate, a pad electrode coupled to the semiconductor circuit, a passivation layer, one or more conductive layers disposed on the pad electrode, and a bump structure disposed on the one or more conductive layers. The bump structure includes an under-cut at an interface between the bump structure and an uppermost layer of the one or more first conductive layers. In one or more of the foregoing or following embodiments, the under-cut is only partially formed and no under-cut is formed at a remaining part between the bump structure and the uppermost layer of the one or more first conductive layers. In one or more of the foregoing or following embodiments, the one or more conductive layers on which the bump structure is formed has an island shape surrounded by a ring shaped groove. In one or more of the foregoing or following embodiments, the bump structure has an overhang over the ring shaped groove. In one or more of the foregoing or following embodiments, a distance from an edge of the ring shaped groove to a lateral end of the under-cut is smaller than a distance from a side face of the bump structure to the lateral end of the under-cut. In one or more of the foregoing or following embodiments, a distance from an edge of the ring shaped groove to a lateral end of the under-cut is greater than a distance from a side face of the bump structure to the lateral end of the under-cut. In one or more of the foregoing or following embodiments, a part of the bump structure is formed in the ring shaped groove. In one or more of the foregoing or following embodiments, at least a part of an uppermost layer of the one or more conductive layers is exposed from the bump structure in a plan view. In one or more of the foregoing or following embodiments, the bump structure has a rectangular shape in plan view, and the under-cut is disposed at one side of the rectangular shape. In one or more of the foregoing or following embodiments, two under-cuts are disposed at two sides of the rectangular shape. In one or more of the foregoing or following embodiments, the bump structure includes two or more conductive layers. In one or more of the foregoing or following embodiments, an uppermost one of the two or more conductive layers is a solder layer. In one or more of the foregoing or following embodiments, the solder layer includes at least one selected from the group consisting of AgSn, SnAgCu, PbSn, and CuSn. In one or more of the foregoing or following embodiments, one of the two or more conductive layers includes Ni.

In accordance with another aspect of the present disclosure, a semiconductor device includes a semiconductor circuit disposed over a substrate, a plurality of pad electrodes coupled to the semiconductor circuit, a passivation layer, and a plurality of bump electrodes, each of which is disposed on a corresponding one of the plurality of pad electrodes. Each of the plurality of bump electrodes includes a first conductive layer disposed on each of the plurality of pad electrodes, a second conductive layer disposed on the first conductive layer, and a bump structure disposed on the second conductive layer. A bus bar pattern formed of same materials as the first and second conductive layers is disposed between adjacent ones of the plurality of bump electrodes. The plurality of the bump electrodes are separated from each other and from the bus bar pattern by a plurality of ring shaped grooves. In one or more of the foregoing or following embodiments, each of the plurality of bump electrodes comprises an under-cut at an interface between the bump structure and the second conductive layer. In one or more of the foregoing or following embodiments, the under-cut is asymmetric with respect to a center of the bump structure in plan view.

In accordance with another aspect of the present disclosure, a semiconductor device includes a semiconductor circuit disposed over a substrate, a pad electrode coupled to the semiconductor circuit, a passivation layer, and a bump electrode disposed on the pad electrode. The bump electrode includes a first conductive layer disposed on the pad electrode, a second conductive layer disposed on the first conductive layer, and a bump structure disposed on the second conductive layer. The bump electrode is surrounded by a bus bar pattern including a lower layer made of a same material as the first conductive layer, and an upper layer made of a same material as the second conductive layer. The bump electrode is separated from the bus bar pattern by a ring shaped groove. In one or more of the foregoing or following embodiments, in plan view, a part of the second conductive layer at least partially surrounds the bump structure. In one or more of the foregoing or following embodiments, in plan view, a part of the second conductive layer fully surrounds the bump structure.

In accordance with another aspect of the present disclosure, a semiconductor device includes a substrate, and at least one bump structure disposed over the substrate. The at least one bump structure includes a bump disposed over an under bump metallization layer. First and second recesses are formed in a lower portion of the bump and in the under bump metallization layer on opposing sides of the bump structure. The first recess extends a greater distance into the bump than the second recess. In one or more of the foregoing or following embodiments, the first recess extends a 2 to 10 times greater distance into the bump than the second recess. In one or more of the foregoing or following embodiments, the under bump metallization layer comprises a second under bump metallization layer disposed over a first under bump metallization layer. In one or more of the foregoing or following embodiments, the first and second under bump metallization layers are made of a metal selected from the group consisting of a titanium-based metal, a gold-based metal, and a copper-based metal. In one or more of the foregoing or following embodiments, the first under bump metallization layer is made of a titanium-based metal, and the second under bump metallization layer is made of a gold-based metal. In one or more of the foregoing or following embodiments, the bump is made of a metal selected from the group consisting of Al, Au, Cr, Fe, Mn, Mg, Mo, Ni, Nb, Ta, Ti, W, Zn, and alloys thereof. In one or more of the foregoing or following embodiments, the semiconductor device includes a plurality of bump structures disposed over the substrate. In one or more of the foregoing or following embodiments, the plurality of bump structures have a width at an uppermost surface of the bump structure ranging from 2 µm to 10 µm. In one or more of the foregoing or following embodiments, immediately adjacent bump structures are spaced apart from each other by a distance ranging from 2 µm to 10 µm.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A semiconductor device, comprising:
a semiconductor circuit disposed over a substrate;
a pad electrode coupled to the semiconductor circuit;
a passivation layer;
one or more conductive layers disposed on the pad electrode; and
a bump structure disposed on the one or more conductive layers, wherein:
the bump structure comprises an under-cut at an interface between the bump structure and an uppermost layer of the one or more conductive layers,
wherein the one or more conductive layers on which the bump structure is formed has an island shape surrounded by a ring shaped groove, and
wherein a distance from an edge of the ring shaped groove to a lateral end of the under-cut is smaller than a distance from a side face of the bump structure to the lateral end of the under-cut.

2. The semiconductor device of claim 1, wherein the under-cut is only partially formed and no under-cut is formed at a remaining part between the bump structure and the uppermost layer of the one or more conductive layers.

3. The semiconductor device of claim 1, wherein the bump structure has an overhang over the ring shaped groove.

4. The semiconductor device of claim 1, wherein a part of the bump structure is formed in the ring shaped groove.

5. The semiconductor device of claim 1, wherein at least a part of an uppermost layer of the one or more conductive layers is exposed from the bump structure in plan view.

6. The semiconductor device of claim 1, wherein:
the bump structure has a rectangular shape in plan view, and
the under-cut is disposed at one side of the rectangular shape.

7. The semiconductor device of claim 6, wherein:
two under-cuts are disposed at two sides of the rectangular shape.

8. The semiconductor device of claim 1, wherein the bump structure includes two or more conductive layers.

9. The semiconductor device according to claim 8, wherein an uppermost one of the two or more conductive layers is a solder layer.

10. The semiconductor device of claim 9, wherein the solder layer includes at least one selected from the group consisting of AgSn, SnAgCu, PbSn, and CuSn.

11. The semiconductor device according to claim 8, wherein one of the two or more conductive layers includes Ni.

12. A semiconductor device, comprising:
a semiconductor circuit disposed over a substrate;
a plurality of pad electrodes coupled to the semiconductor circuit;
a passivation layer; and
a plurality of bump electrodes, each of which is disposed on a corresponding one of the plurality of pad electrodes, wherein:
each of the plurality of bump electrodes includes:
a first conductive layer disposed on each of the plurality of pad electrodes;
a second conductive layer disposed on the first conductive layer; and
a bump structure disposed on the second conductive layer,
a bus bar pattern formed of same materials as the first and second conductive layers is disposed between adjacent ones of the plurality of bump electrodes, and
the plurality of the bump electrodes are separated from each other and from the bus bar pattern by a plurality of ring shaped grooves.

13. The semiconductor device of claim 12, wherein each of the plurality of bump electrodes comprises an under-cut at an interface between the bump structure and the second conductive layer.

14. The semiconductor device of claim 13, wherein the under-cut is asymmetric with respect to a center of the bump structure in plan view.

15. The semiconductor device of claim 12, wherein the bump structure has a rectangular shape in plan view.

16. The semiconductor device of claim 15, wherein the under-cut is disposed at one side of the rectangular shape.

17. The semiconductor device of claim 12, wherein each bump structure has an overhang over one of the plurality of ring shaped grooves.

18. A semiconductor device, comprising:
a semiconductor circuit disposed over a substrate;
a pad electrode coupled to the semiconductor circuit;
a passivation layer; and
a bump electrode disposed on the pad electrode, wherein:
the bump electrode includes:
a first conductive layer disposed on the pad electrode;
a second conductive layer disposed on the first conductive layer; and
a bump structure disposed on the second conductive layer,
the bump electrode is surrounded by a bus bar pattern including a lower layer made of a same material as the first conductive layer, and an upper layer made of a same material as the second conductive layer, and
the bump electrode is separated from the bus bar pattern by a ring shaped groove.

19. The semiconductor device of claim 18, wherein in plan view, a part of the second conductive layer at least partially surrounds the bump structure.

20. The semiconductor device of claim 18, wherein in plan view, a part of the second conductive layer fully surrounds the bump structure.

* * * * *